United States Patent
De et al.

(10) Patent No.: US 11,899,364 B2
(45) Date of Patent: *Feb. 13, 2024

(54) PHOTOSENSITIVE POLYIMIDE COMPOSITIONS

(71) Applicant: Fujifilm Electronic Materials U.S.A., Inc., N. Kingstown, RI (US)

(72) Inventors: Binod B. De, Attleboro, MA (US); Sanjay Malik, Attleboro, MA (US); Raj Sakamuri, Sharon, MA (US); William A. Reinerth, Riverside, RI (US); Ognian N. Dimov, Warwick, RI (US); Ahmad A. Naiini, East Greenwich, RI (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 408 days.

This patent is subject to a terminal disclaimer.

(21) Appl. No.: 16/822,072

(22) Filed: Mar. 18, 2020

(65) Prior Publication Data

US 2020/0218152 A1 Jul. 9, 2020

Related U.S. Application Data

(63) Continuation of application No. 15/132,472, filed on Apr. 19, 2016, now abandoned.

(60) Provisional application No. 62/263,372, filed on Dec. 4, 2015, provisional application No. 62/185,424, filed on Jun. 26, 2015, provisional application No. 62/150,381, filed on Apr. 21, 2015.

(51) Int. Cl.
| | |
|---|---|
| *G03F 7/038* | (2006.01) |
| *G03F 7/32* | (2006.01) |
| *G03C 1/805* | (2006.01) |
| *G03F 7/34* | (2006.01) |
| *B29C 67/00* | (2017.01) |
| *H01L 21/02* | (2006.01) |
| *H01L 21/311* | (2006.01) |
| *C09D 179/08* | (2006.01) |
| *C08G 73/10* | (2006.01) |
| *G03F 7/037* | (2006.01) |
| *G03F 7/11* | (2006.01) |
| *G03F 7/16* | (2006.01) |
| *H01L 21/027* | (2006.01) |

(52) U.S. Cl.
CPC ............ *G03F 7/0387* (2013.01); *B29C 67/00* (2013.01); *C08G 73/1014* (2013.01); *C08G 73/1039* (2013.01); *C08G 73/1042* (2013.01); *C08G 73/1046* (2013.01); *C08G 73/1067* (2013.01); *C09D 179/08* (2013.01); *G03C 1/805* (2013.01); *G03F 7/037* (2013.01); *G03F 7/11* (2013.01); *G03F 7/16* (2013.01); *G03F 7/325* (2013.01); *G03F 7/343* (2013.01); *H01L 21/0273* (2013.01); *H01L 21/02118* (2013.01); *H01L 21/311* (2013.01)

(58) Field of Classification Search
CPC . G03F 7/0387; G03F 7/11; G03F 7/09; G03F 7/037

See application file for complete search history.

(56) References Cited

U.S. PATENT DOCUMENTS

| | | | |
|---|---|---|---|
| 4,033,768 A | 7/1977 | Wieloch | |
| 4,681,654 A | 7/1987 | Clementi et al. | |
| 4,786,569 A | 11/1988 | Rohde et al. | |
| 4,830,953 A | 5/1989 | Bateman | |
| 4,988,413 A | 1/1991 | Chakravorty et al. | |
| 5,206,117 A | 4/1993 | Labadie et al. | |
| 5,633,117 A | 5/1997 | Barjesteh et al. | |
| 5,925,498 A | 7/1999 | Dominh et al. | |
| 6,057,079 A | 5/2000 | Shelnut | |
| 6,599,675 B2 | 7/2003 | Kamada et al. | |
| 6,878,500 B2 | 4/2005 | Rutter, Jr. et al. | |
| 7,141,614 B2 | 11/2006 | Okada et al. | |
| 7,476,476 B2 | 1/2009 | Suwa | |
| 7,645,561 B1 | 1/2010 | Kimura et al. | |
| 10,036,952 B2 * | 7/2018 | Malik | C08G 73/1042 |
| 10,781,341 B2 | 9/2020 | Malik et al. | |
| 10,875,965 B2 | 12/2020 | Malik et al. | |
| 2002/0182536 A1 | 12/2002 | Kamada et al. | |
| 2003/0087179 A1 | 5/2003 | Iwasaki | |
| 2003/0138733 A1 | 7/2003 | Sachdev et al. | |
| 2004/0048978 A1 | 3/2004 | Okada et al. | |
| 2004/0161619 A1 | 8/2004 | Rushkin et al. | |
| 2004/0235992 A1 | 11/2004 | Okada et al. | |
| 2004/0265731 A1 | 12/2004 | Okada et al. | |
| 2006/0159839 A1 | 7/2006 | Suwa | |
| 2006/0199920 A1 | 9/2006 | Okada et al. | |

(Continued)

FOREIGN PATENT DOCUMENTS

| | | | |
|---|---|---|---|
| CN | 1366534 | 8/2002 | ............ C08G 73/10 |
| CN | 1522387 | 8/2004 | ............ G03F 7/037 |

(Continued)

OTHER PUBLICATIONS

Office Action issued in Chinese Application No. CN 201680036215.6 dated Aug. 21, 2020 (with English Translation).

Decision of Rejection issued in Chinese Application No. CN 201680036233.4, dated Jul. 29, 2021 (with English Translation).

Notification of Second Office Action issued by the Chinese Patent Office for Chinese Application No. 201680036233.4, dated Mar. 31, 2021 (with English Translation).

English Translation of Chinese Office Action for Chinese Application No. CN 201680036233.4 dated Jun. 16, 2020 (with English Translation).

(Continued)

*Primary Examiner* — Daborah Chacko-Davis

(74) *Attorney, Agent, or Firm* — Fish & Richardson P.C.

(57) ABSTRACT

This disclosure relates to a dry film structure that includes a carrier substrate, and a polymeric layer supported by the carrier substrate. The polymeric layer includes at least one fully imidized polyimide polymer.

22 Claims, No Drawings

(56) References Cited

U.S. PATENT DOCUMENTS

| | | |
|---|---|---|
| 2006/0210819 A1 | 9/2006 | Dueber |
| 2006/0240358 A1 | 10/2006 | Powell et al. |
| 2006/0286484 A1 | 12/2006 | Powell et al. |
| 2007/0083016 A1 | 4/2007 | Dueber et al. |
| 2008/0081294 A1 | 4/2008 | Yamanaka et al. |
| 2008/0108723 A1 | 5/2008 | Taniguchi et al. |
| 2008/0241752 A1 | 10/2008 | Mizutani et al. |
| 2009/0035693 A1 | 2/2009 | Sato et al. |
| 2009/0191356 A1 | 7/2009 | Lee et al. |
| 2009/0191385 A1 | 7/2009 | Miyazaki et al. |
| 2009/0202793 A1 | 8/2009 | Tanaka et al. |
| 2010/0218984 A1 | 9/2010 | Yamanaka et al. |
| 2011/0278049 A1 | 11/2011 | Kim et al. |
| 2012/0070781 A1 | 3/2012 | Katayama et al. |
| 2012/0097435 A1 | 4/2012 | Goshima et al. |
| 2012/0248632 A1 | 10/2012 | Mitsukura et al. |
| 2013/0105998 A1 | 5/2013 | Matsumura et al. |
| 2014/0192305 A1 | 7/2014 | Lincker et al. |
| 2014/0343199 A1 | 11/2014 | Malik et al. |
| 2015/0219990 A1 | 8/2015 | Malik et al. |
| 2016/0002407 A1* | 1/2016 | Wakita .................. H01L 51/52 528/188 |
| 2016/0032055 A1 | 2/2016 | Urakami et al. |
| 2016/0313641 A1 | 10/2016 | De et al. |
| 2016/0313642 A1 | 10/2016 | Malik et al. |
| 2019/0171105 A1 | 6/2019 | Malik et al. |

FOREIGN PATENT DOCUMENTS

| | | | |
|---|---|---|---|
| CN | 1599884 | 3/2005 | ............. G03F 7/027 |
| CN | 101371197 | 2/2009 | ............. G03F 7/095 |
| CN | 101925861 | 12/2010 | ............. G03F 7/004 |
| CN | 102597061 | 7/2012 | ............. C08G 73/10 |
| CN | 102985505 | 3/2013 | ............. C09J 179/08 |
| CN | 106164132 | 11/2016 | ............. G08G 73/10 |
| JP | S 62-56948 | 3/1987 | ............... G03C 1/00 |
| JP | 1-109792 | 4/1989 | ............... H05K 3/18 |
| JP | H 5-39218 | 2/1993 | ............. C07D 307/89 |
| JP | 2002-121207 | 4/2002 | ................ C08F 2/44 |
| JP | 2003-140336 | 5/2003 | ............. G03F 7/027 |
| JP | 2013-200328 | 10/2013 | ............. G03F 7/037 |
| TW | 200030519 | 6/2003 | ............. G03F 7/004 |
| TW | 200700901 | 1/2007 | ............. G08L 79/08 |
| TW | I359329 | 3/2012 | ............. G03F 7/004 |
| TW | 201237101 | 9/2012 | ............. C08L 79/08 |
| TW | 201338970 | 10/2013 | ........... B32B 15/088 |
| TW | 201500408 | 1/2015 | ............. C08G 73/10 |
| TW | 201500464 | 1/2015 | ............. C08L 79/08 |
| TW | I473791 | 2/2015 | ........... C07D 211/16 |
| WO | WO 02/097532 | 12/2002 | ............. G03F 7/037 |
| WO | WO 2004/092838 | 10/2004 | ............. G03F 7/027 |
| WO | WO 2007/086385 | 8/2007 | ............. G03F 7/095 |
| WO | WO 2009/096292 | 8/2009 | ............. G03F 7/004 |
| WO | WO 2010/044381 | 4/2010 | ............. C08G 73/10 |
| WO | WO 2014/107108 | 7/2014 | ........... H01L 23/498 |
| WO | WO 2014/186785 | 11/2014 | ................ C02F 1/54 |
| WO | WO 2015/116657 | 8/2015 | ............. G08G 73/10 |

OTHER PUBLICATIONS

Taiwan Office Action and Search Report for Taiwan Application No. TW 10511228 dated May 28, 2020 and English summary.
Japanese Decision of Refusal for Japanese Application No. JP 2017-555458, dated Jul. 13, 2020 (with English Translation).
Taiwan Office Action and Search Report for Taiwan Application No. 105112286 dated Jun. 22, 2020 (with English Translation).
Notice of Reasons for Rejection issued by the Japanese Patent Office for Application No. JP 2020-194759, dated Dec. 7, 2021 (with English Translation).
Examination Report issued by the Intellectual Property Office of the Philippines for Philippines Application No. 1-2017-501907, dated Jan. 26, 2021.
Office Action and Search Report for Taiwan Application No. TW 105112286 dated Dec. 22, 2020 (with English summary).
Notification of Second Office Action issued by the Chinese Patent Office for Application No. CN 201680036215.6, dated Apr. 25, 2021 (with English Translation).
International Preliminary Report on Patentability and Written Opinion for International Application No. PCT/US2016/028258 dated Nov. 2, 2017 (18 pages).
International Preliminary Report on Patentability and Written Opinion for International Application No. PCT/US2016/028262 dated Nov. 2, 2017 (11 pages).
International Search Report and Written Opinion issued in International Application No. PCT/US16/28262 dated Jul. 18, 2016 (17 pages).
International Search Report and Written Opinion of the International Searching Authority for International Application No. PCT/US16/28258, dated Jul. 21, 2016 (26 pages).
Taiwan Office Action and Search Report for Taiwan Application No. TW 105112286 dated Jan. 16, 2020 (with English Translation).
Japanese Office Action for Japanese Patent Application No. JP 2017-555458 dated Feb. 19, 2020 (With English Translation).
Supplementary European Search Report for European Application No. EP 16 78 3680 dated Dec. 4, 2018 (6 pages).
Supplementary European Search Report for European Application No. EP 16 78 3682 dated Dec. 7, 2018 (6 pages).
Taiwan Office Action and Search Report for Taiwan Application No. TW 10511228 dated Nov. 15, 2019 and English summary.
Ku, "Lecture 16—Introduction to Optical Lithography", *EECS 598-002 Winter 2006 Nanophotinics and Nano-scale Fabrication*, 25 pages obtained from the web on Oct. 14, 2019 (Year: 2006).
Mack, "Pitch: The Other Resolution", *The Lithography Expert*, 4 pages obtained from the web on Oct. 14, 2019 (Year: 1998).
Examination Report from the Philippines Patent Office for Application No. 1-2017-501936 dated Mar. 13, 2020.
Japanese Office Action for Japanese Patent Application No. 2017-555469 dated Mar. 11, 2020 (with machine English Translation).
Office Action in Korean Appln. No. 10-2017-7033716, dated Oct. 3, 2022, 8 pages (with English translation).
Office Action in Korean Appln. No. 10-2017-7033711, dated Aug. 1, 2023, 30 pages (with English translation).

\* cited by examiner

PHOTOSENSITIVE POLYIMIDE COMPOSITIONS

CROSS-REFERENCE TO RELATED APPLICATIONS

The present application is a continuation of U.S. Utility application Ser. No. 15/132,472, filed on Apr. 19, 2016, which claims priority to U.S. Provisional Application Ser. No. 62/263,372, filed on Dec. 4, 2015, U.S. Provisional Application Ser. No. 62/185,424, filed on Jun. 26, 2015, and U.S. Provisional Application Serial No. 62/150,381, filed on Apr. 21, 2015. The prior applications are hereby incorporated by reference in their entirety.

BACKGROUND OF THE DISCLOSURE

Increasingly, semiconductor devices are being utilized in many new embedded applications including a host of new mobile devices. In order to allow this expansion to continue, the manufacturing costs for these semiconductor devices must be reduced. While multiple pathways are being pursued, switching from wafers to large non-circular panels offers several key cost advantages.

Circular substrates, such as silicon wafers, permit coating materials like photoresists and dielectric materials to be applied by spin coating. For decades, spin coating has been the preferred method for applying photosensitive materials to semiconductor substrates. In recent years the semiconductor industry has begun to explore methods for applying photosensitive coatings to large, non-circular panel substrates. These substrates, which may be flexible or rigid, present special challenges and require alternative methods for processing and applying semiconductor coatings. One preferred method for applying coatings to these advanced substrates is the use of a dry, polymeric film which can be applied to virtually any type of substrate. Once applied, the dry film is then laminated so that the semiconductor coating is affixed to the substrate. In the case of a photoimageable dry film resist material, after this lamination step the resist material is patternwise exposed to radiation and developed.

One important class of photoimageable dry film resist materials is photoimageable dielectrics (PIDs). Next generation semiconductor packaging requires PID materials that possess a combination of excellent lithographic resolution, superior thermal and mechanical properties as well as chemical stability. Resolution of these PID materials should allow the printing of fine features (<3 microns) with high aspect ratios (>2:1). Current PID materials possess numerous deficiencies making them unable to meet the requirements of next generation semiconductor packaging applications. Two key obstacles that current materials have yet to overcome are (1) patterning of high resolution (<3 micron) features and (2) production of thin (<5 micron) PID dry films. This necessitates the development of advanced dry film PID materials to meet these needs. The dry film PID materials of this disclosure address the needs of advanced packaging applications by overcoming the limitations of current materials.

SUMMARY OF THE DISCLOSURE

In one aspect, this disclosure features a dry film structure that includes a carrier substrate, and a photosensitive polymeric layer supported by the carrier substrate, the photosensitive polymeric layer including at least one fully imidized polyimide polymer; wherein the photosensitive polymeric layer has a film thickness of at most about 5 microns (e.g., at most about 4 microns or at most about 3 microns). In some embodiments, the photosensitive polymeric layer further includes at least one reactive functional compound (RFC) and at least one photoinitiator.

In some embodiment the at least one fully imidized polyimide polymer is prepared from at least one diamine, the at least one diamine including a compound selected from the group consisting of a diamine of Structure (Ia) and a diamine of Structure (Ib),

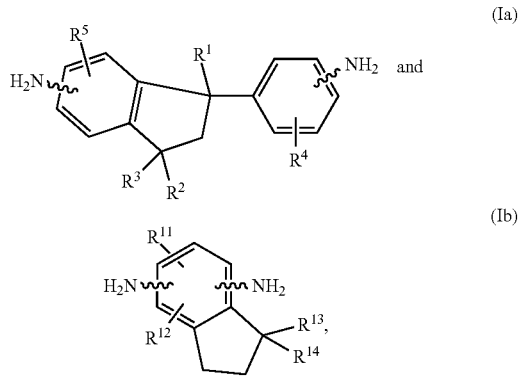

in which each of $R^1$, $R^2$, $R^3$, $R^4$, $R^5$, $R^{11}$, $R^{12}$, $R^{13}$, and $R^{14}$, independently, is H, a substituted or unsubstituted $C_1$-$C_6$ linear or branched alkyl group, or a $C_5$-$C_7$ cycloalkyl group.

In some embodiments, the at least one diamine is selected from the group consisting of 1-(4-aminophenyl)-1,3,3-trimethylindan-5-amine, 1-(4-aminophenyl)-1,3,3-trimethyl-2H-inden-5-amine, 1-(4-aminophenyl)-1,3,3-trimethyl-indan-5-amine, [1-(4-aminophenyl)-1,3,3-trimethyl-indan-5-yl]amine, and 1-(4-aminophenyl)-2,3-dihydro-1,3,3-trimethyl-1H-inden-5-amine), 5-amino-6-methyl-1-(3'-amino-4'-methylphenyl)-1,3,3-trimethylindan, 4-amino-6-methyl-1-(3'-amino-4'-methylphenyl)-1,3,3-trimethylindan, 5,7-diamino-1,1-dimethylindan, 4,7-diamino-1,1-dimethylindan, 5,7-diamino-1,1,4-trimethylindan, 5,7-diamino-1,1,6-trimethylindan, and 5,7-diamino-1,1-dimethyl-4-ethylindan.

In some embodiments, the at least one diamine includes (a) a compound selected from the group consisting of a diamine of Structure (Ia) and a diamine of Structure (Ib), and (b) at least one diamine of Structure (II),

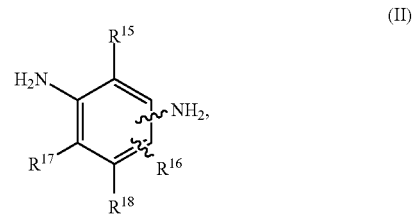

in which $R^{15}$, $R^{16}$, $R^{17}$ and $R^{18}$, independently, can be H, a substituted or unsubstituted $C_1$-$C_6$ linear or branched alkyl group, or $C_5$-$C_7$ cycloalkyl group, provided that at least two of $R^{15}$, $R^{16}$ $R^{17}$ and $R^{18}$ are not hydrogen.

In some embodiments, the at least one diamine of Structure (II) is selected from the group consisting of 2,3,5,6-tetramethylphenylenediamine, 2,4-diamino-1,3,5-trimethylbenzene, 2,4-diamino-1,3,5-triethylbenzene, 2,4-diamino-3,5-dimethyl-1-ethylbenzene, 2,4-diamino-1,5-dimethyl-3-ethylbenzene 2,4-diamino-1,3,5-triisopropylbenzene, 2,3,5,6-tetraisopropyl-phenylenediamine and 2,4-diamino-1,3,5,6-tetramethylbenzene.

In some embodiments, the at least one fully imidized polyimide polymer is prepared from at least one dianhydride, the at least one dianhydride including a compound selected from the group consisting of 3,3',4,4'-benzophenone tetracarboxylic dianhydride, 3,3', 4, 4'-diphenylsulfone tetracarboxylic dianhydride, 3,3',4,4'-diphenyl ether tetracarboxylic dianhydride, 2,3,3',4'-diphenyl ether tetracarboxylic dianhydride, and 2,2-[bis(3,4-dicarboxyphenyl)]hexafluoropropane dianhydride.

In some embodiments, the at least one fully imidized polyimide polymer is prepared from at least one dianhydride, the at least one dianhydride including a compound selected from the group consisting of:

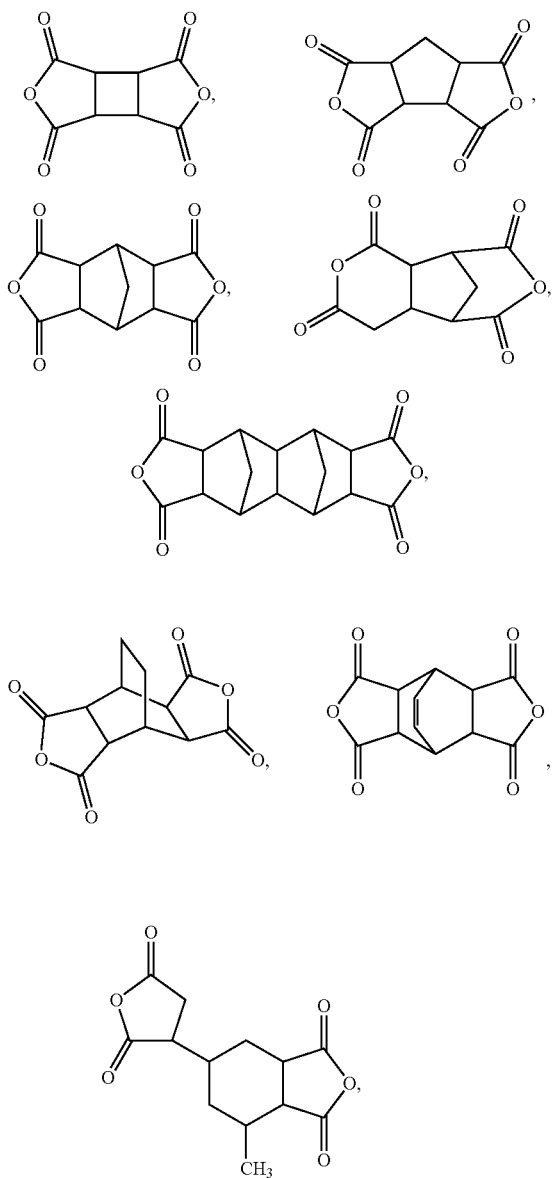

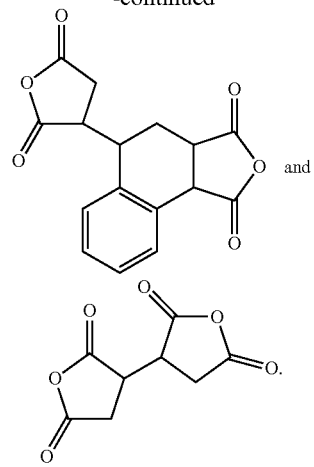

and

In some embodiments, the reactive functional compound includes at least one functional group selected from the group consisting of a vinyl group, an allyl group, a vinyl ether group, a propenyl ether group, a (meth)acryloyl group, an a SiH group, and a thiol group.

In some embodiments, the reactive functional compounds is selected from the group consisting of 1,6-hexanediol di(meth)acrylate, tetraethyleneglycol di(meth)acrylate, divinylbenzene, ethoxylated bisphenol-A-di(meth)acrylate, diethylene glycol bis(allyl carbonate), trimethylolpropane tri(meth)acrylate, ditrimethylolpropane tetra(meth)acrylate, pentaerythritol tri(meth)acrylate, pentaerythritol tetra(meth)acrylate, dipentaerythritol penta-/hexa-(meth)acrylate, isocyanurate tri(meth)acrylate, bis(2-hydroxyethyl)-isocyanurate di(meth)acrylate, 1,3-butanediol tri(meth)acrylate, 1,4-butanediol tri(meth)acrylate, methyl (meth)acrylate, butyl (meth)acrylate, cyclohexyl (meth)acrylate, benzyl(meth)acrylate, neopentyl glycol di(meth)acrylate, (meth)acrylate modified-urea-formaldehyde resins, (meth)acrylate modified melamine-formaldehyde resins and (meth)acrylate modified cellulose.

In some embodiments, the dry film structure can further include a protective layer, in which the first polymeric layer is between the carrier substrate and the protective layer.

In some embodiments, the dry film structure can further include a second polymeric layer, in which the second polymeric layer is between the photosensitive polymeric layer and the carrier substrate or the second polymeric layer is between the photosensitive polymeric layer and the optional protective layer. In some embodiments, the second polymeric layer can include a water soluble polymer.

In some embodiments, the photosensitive polymeric layer is capable of forming a patterned layer containing at least one element having a feature size of at most about 3 microns after the photosensitive polymeric layer is exposed to actinic radiation and developed.

In some embodiments, this disclosure features methods for preparation of a dry film structure. The method includes: (a) coating a carrier substrate with a photosensitive polymeric composition (e.g., a negative tone photosensitive polymeric composition) to form a coated composition, (b) drying the coated composition to form a photosensitive polymeric layer, and (c) applying a protective layer to the photosensitive polymeric layer to form a dry film structure. In some embodiments, the photosensitive polymeric layer has a film thickness of at most about 5 microns. In some embodiments, the photosensitive polymeric composition contains at least one polyimide polymer described in this disclosure, at least one reactive functional compound (RFC), at least one initiator, and optionally at least one solvent.

In some embodiments, this disclosure features a process of forming a laminate. The process can include applying the dry film structure described herein onto an electronic substrate to form a laminate. In embodiments where the dry film structure includes a protective layer, the process can further include removing the protective layer from the dry film structure before applying the dry film structure. In some embodiments, the process can further include converting the photosensitive polymeric layer into a patterned layer. The conversion can include exposing the photosensitive polymeric layer in the laminate to actinic radiation. In such embodiments, the conversion can further include removing the carrier substrate before or after exposing the photosensitive polymeric layer. After the photosensitive polymeric layer is exposed to actinic radiation, the conversion can further include developing the exposed photosensitive polymeric layer to form a patterned layer having a relief pattern. The developing can include removing unexposed portions in the polymeric layer by using a developer to form a patterned layer having a relief pattern and rinsing the relief pattern on the substrate with a solvent or a mixture of solvents.

In some embodiments, this disclosure features a process of forming a patterned film (e.g., a laminate containing a patterned film). Such a process can be performed, for example, by: (a) providing a dry film structure including: a carrier substrate; a protective layer; and a photosensitive polymeric layer between the carrier substrate and the protective layer; in which the photosensitive polymeric layer has a film thickness of at most about 5 microns, (b) removing the protective layer from the dry film structure; (c) applying the structure obtained in step (b) onto an electronic substrate to form a laminate, the laminate containing the photosensitive polymeric layer between the electronic substrate and the carrier substrate; and (d) converting the photosensitive polymeric layer into a patterned layer; in which the patterned layer has a thickness of at most about 5 microns (e.g., at most about 4 microns or at most about 3 microns) and includes at least one element having a feature size of at most about 3 microns. In some embodiments, the photosensitive polymeric layer include at least one fully imidized polyimide polymer; at least one reactive functional compound (RFC), and at least one photoinitiator.

In some embodiments, this disclosure features a three dimensional object including at least one pattern film formed by a process described herein. In some embodiments, the three dimensional objects can include pattern films in at least two stacks (e.g., at least three stacks).

In some embodiments, the disclosure features a semiconductor device that includes the three dimensional object described herein. In some embodiments, the semiconductor device is an integrated circuit, a light emitting diode, a solar cell, or a transistor.

DETAILED DESCRIPTION OF THE DISCLOSURE

In the context of this disclosure, lamination is a process for affixing or adhering the polymeric layer of a dry film structure to a surface of a substrate (e.g., an electronic substrate). Pre-lamination is treatment of the substrate prior to lamination. Pre-lamination includes, but is not limited to, rinsing the substrate with solvent or additive and drying before lamination.

As mentioned herein, the phrase "unexposed film" or "a film unexposed to actinic radiation" refers to a film unexposed to actinic radiation under lithographic conditions used to form patterns.

As used herein, the term "fully imidized" means the polyimide polymers of this disclosure are at least about 90% (e.g., at least about 95%, at least about 98%, at least about 99%, or about 100%) imidized. Imidization to form a polyimide can be confirmed by observation of characteristic absorptions in the infrared spectrum from 1770 and 1700 $cm^{-1}$ attributable to the imide ring structure.

In general, this disclosure relates to dry film structures and laminates formed by such a dry film structure, as well as the processes of making or using the dry film structures or laminates. In some embodiments, the dry film structures can include a carrier substrate, and a photosensitive polymeric layer supported by the carrier substrate. The photosensitive polymeric layer can be prepared from a photosensitive polymeric composition (e.g., a negative tone photosensitive polymeric composition) by coating the composition on a carrier substrate. The photosensitive polymeric layer or photosensitive polymeric composition can contain the following components: (A) at least one polyimide polymer (e.g., at least one fully imidized polyimide polymer), (B) at least one reactive functional compound (RFC); and (C) at least one photoinitiator. In some embodiments, the dry film structure can further include a protective layer such that the photosensitive polymeric layer is between the carrier substrate and the protective layer. In some embodiments, the photosensitive polymeric layer can have a film thickness of at most 5 microns and a resolution (e.g., the feature size of an element formed in the photosensitive polymeric layer) of at most 3 microns.

In some embodiments, the at least one fully imidized polyimide (i.e., component (A)) of the photosensitive polymeric composition or the polymeric layer of the dry film structure is prepared by reaction of at least one diamine as a monomer with at least one dianhydride (e.g., at least one tetracarboxylic acid dianhydride) as another monomer. Examples of diamines include, but are not limited to, 1-(4-aminophenyl)-1,3,3-trimethylindan-5-amine (alternative names including 4,4'-[1,4-phenylene-bis(1-methylethylidene)]bisaniline), 1-(4-aminophenyl)-1,3,3-trimethyl-2H-inden-5-amine, 1-(4-aminophenyl)-1,3,3-trimethyl-indan-5-amine, [1-(4-aminophenyl)-1,3,3-trimethyl-indan-5-yl]amine, and 1-(4-aminophenyl)-2,3-dihydro-1,3,3-trimethyl-1H-inden-5-amine), 5-amino-6-methyl-1-(3'-amino-4'-methylphenyl)-1,3,3-trimethylindan, 4-amino-6-methyl-1-(3'-amino-4'-methylphenyl)-1,3,3-trimethylindan, 5,7-diamino-1,1-dimethylindan, 4,7-diamino-1,1-dimethylindan, 5,7-diamino-1,1,4-trimethylindan, 5,7-diamino-1,1,6-trimethylindan, 5,7-diamino-1,1-dimethyl-4-ethylindan, p-phenylenediamine, m-phenylenediamine, o-phenylenediamine, 3-methyl-1,2-benzene-diamine, 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,2-diaminocyclohexane, 1,4-diaminocyclohexane, 1,3-cyclohexanebis(methylamine), 5-amino-1,3,3-trimethyl cyclohexanemethanamine, 2,5-diaminobenzotrifluoride, 3,5-diaminobenzotrifluoride, 1,3-diamino-2,4,5,6-tetrafluorobenzene, 4,4'-oxydianiline, 3,4'-oxydianiline, 3,3'-oxydianiline, 3,3'-diaminodiphenylsulfone, 4,4'-diaminodiphenylsulfones, 4,4'-isopropylidenedianiline, 4,4'-diaminodiphenylmethane, 2,2-bis(4-aminophenyl)propane, 4,4' diaminodiphenyl propane, 4,4'-diaminodiphenyl sulfide, 4,4'-diaminodiphenylsulfone, 4-aminophenyl-3-aminobenzoate, 2,2'-dimethyl-4,4'-diaminobiphenyl, 3,3'-dimethyl-4,4'-diaminobiphenyl, 2,2'-bis(trifluoromethyl)benzidine, 3,3'-bis(trifluoromethyl)benzidine, 2,2-bis [4-(4-aminophenoxy phenyl)] hexafluoropropane, 2,2-bis(3-amino-4-methylphenyl)-hexafluoropropane, 2,2-bis(3-aminophenyl)-1,1,1,3,3,3-hexafluoropropane, 1,3-bis-(4-aminophenoxy)benzene, 1,3-bis-(3-aminophenoxy)benzene, 1,4-bis-(4-aminophenoxy)benzene, 1,4-bis-(3-aminophenoxy)benzene, 1-(4-aminophenoxy)-3-(3-aminophenoxy)benzene, 2,2'-bis-(4-phenoxyaniline)isopropylidene, bis(p-beta-amino-t-butylphenyl)ether, p-bis-2-(2-methyl-4-aminopentyl)benzene, p-bis(1,1-dimethyl-5-aminopentyl)benzene, 3,3'-dimethyl-4,4'-diaminobiphenyl, 4,4'-diaminobenzophenone, 3'-dichlorobenzidine, 2,2-bis [4-(4-aminophenoxy)phenyl] propane, 4,4'-[1,3-phenylenebis(1-Methyl-ethylidene)] bisaniline, 4,4'-[1,4-phenylenebis(1-methyl-ethylidene)] bisaniline, 2,2-bis [4-(4-aminophenoxy)phenyl] sulfone, 2,2-bis [4-(3-aminophenoxy)benzene], 1,4-bis(4-aminophenoxy)benzene, 1,3-bis(4-aminophenoxy)benzene, (1,3'-bis (3-aminophenoxy)benzene, and 9H-fluorene-2,6-diamine.

In some embodiments, the at least one diamine includes a compound selected from the group consisting of a diamine of Structure (Ia) and a diamine of Structure (Ib):

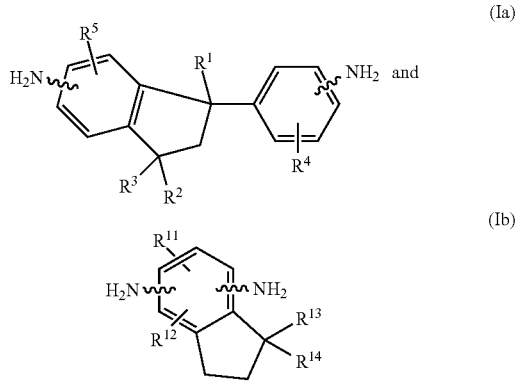

in which each of $R^1$, $R^2$, $R^3$, $R^4$, $R^5$, $R^{11}$, $R^{12}$, $R^{13}$, and $R^{14}$, independently, is H, a substituted or unsubstituted $C_1$-$C_6$ linear or branched alkyl group, or $C_5$-$C_7$ cycloalkyl group.

Examples of the substituted or unsubstituted $C_1$-$C_6$ linear or branched alkyl groups in $R^1$, $R^2$, $R^3$, $R^4$, $R^5$, $R^{11}$, $R^{12}$, $R^{13}$, and $R^{14}$ include, but are not limited to, methyl, ethyl, propyl, isopropyl, butyl, isobutyl, t-butyl, amyl, hexyl, and 2-methylhexyl. Examples of the $C_5$-$C_7$ cycloalkyl group in $R^1$, $R^2$, $R^3$, $R^4$, $R^5$, $R^{11}$, $R^{12}$, $R^{13}$, and $R^{14}$ include, but are not limited to, cyclopentyl, cyclohexyl, and cycloheptyl.

Examples of diamines of Structure (Ia) or (Ib) include, but are not limited to, 1-(4-aminophenyl)-1,3,3-trimethylindan-5-amine (alternative names including 4,4'-[1,4-phenylene-bis(1-methylethylidene)] bisaniline, 1-(4-aminophenyl)-1,3,3-trimethyl-2H-inden-5-amine, 1-(4-aminophenyl)-1,3,3-trim ethyl-indan-5-amine, [1-(4-aminophenyl)-1,3,3-trimethyl-indan-5-yl]amine, and 1-(4-aminophenyl)-2,3-dihydro-1,3,3-trimethyl-1 H-inden-5-amine), 5-amino-6-methyl-1-(3'-amino-4'-methylphenyl)-1,3,3-trimethylindan, 4-amino-6-methyl-1-(3'-amino-4'-methylphenyl)-1,3,3-trimethylindan, 5,7-diamino-1,1-dimethylindan, 4,7-diamino-1,1-dimethylindan, 5,7-diamino-1,1,4-trimethylindan, 5,7-diamino-1,1,6-trimethylindan, and 5,7-diamino-1,1-dimethyl-4-ethylindan.

In some embodiments, the at least one diamine includes (a) a compound selected from the group consisting of a diamine of Structure (Ia) and a diamine of Structure (Ib), and (b) at least one diamine of Structure (II),

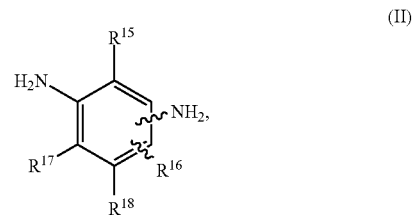

in which each of $R^{15}$, $R^{16}$, $R^{17}$ and $R^{18}$, independently, can be H, a substituted or unsubstituted $C_1$-$C_6$ linear or branched alkyl group, or $C_5$-$C_7$ cycloalkyl group, provided that at least two of $R^{15}$, $R^{16}$, $R^{17}$ and $R^{18}$ are not hydrogen.

Examples of the substituted or unsubstituted $C_1$-$C_6$ linear or branched alkyl groups in $R^{15}$, $R^{16}$, $R^{17}$ and $R^{18}$ include, but are not limited to, methyl, ethyl, propyl, isopropyl, butyl, isobutyl, t-butyl, amyl, hexyl, and 2-methylhexyl. Examples of the $C_5$-$C_7$ cycloalkyl group in $R^{15}$, $R^{16}$, $R^{17}$ and $R^{18}$ include, but are not limited to, cyclopentyl, cyclohexyl, and cycloheptyl.

Examples of diamines of Structure (II) include, but are not limited to, 2,3,5,6-tetramethylphenylenediamine, 2,4-diamino-1,3,5-trimethylbenzene, 2,4-diamino-1,3,5-triethylbenzene, 2,4-diamino-3,5-dimethyl-1-ethylbenzene, 2,4-diamino-1,5-dimethyl-3-ethylbenzene, 2,4-diamino-1,3,5-triisopropylbenzene, 2,3,5,6-tetraisopropyl-phenylenediamine and 2,4-diamino-1,3,5,6-tetramethylbenzene.

In some embodiments, the molar percentage of the diamines of Structures (Ia) and (Ib) in the total amount of diamines (e.g., diamines of Structures (Ia), (Ib), and (II)) is at least about 10% (e.g., at least about 20%, at least about 25%, at least about 30%, at least about 35%, at least about 40%, at least about 45%, or at least about 50%) to at most about 90% (e.g., at most about 85%, at most about 80%, at most about 75%, at most about 70%, at most about 65%, or at most about 60%).

In some embodiments, the molar percentage of the diamines of Structure (II) in the total amount of diamines (e.g., diamines of Structure (Ia), (Ib), and (II)) is at least about 10% (e.g., at least about 20%, at least about 25%, at least about 30%, at least about 35%, at least about 40%, at least about 45%, or at least about 50%) to at most about 90% (e.g., at most about 85%, at most about 80%, at most about 75%, at most about 70%, at most about 65%, or at most about 60%).

In general, to form a polyimide polymer described herein, the diamines can be reacted with at least one dianhydride, such as at least one tetracarboxylic acid dianhydride.

In some embodiments, the tetracarboxylic acid dianhydrides have the Structure (V) with a moiety Y.

Structure (V)

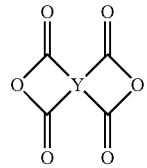

In formula (V), the moiety Y is a tetravalent organic group, such as a group selected from the group consisting of:

a) a substituted or unsubstituted $C_6$-$C_{18}$ mononuclear or fused polynuclear aromatic group, b) a substituted or unsubstituted $C_2$-$C_{18}$ linear, branched, cyclic or fused polycyclic alkylene group, c) a substituted or unsubstituted heterocyclic group, d) a tetravalent group of Structure (VI-a), (VI-b), (VI-c), (VI-d), (VI-e), (VI-f), (VI-g), (VI-h), (VI-i), or (VI-j), where $R^{31}$ to $R^{41}$ are independently a hydrogen atom or a substituted or unsubstituted $C_1$-$C_{10}$ linear or branched alkyl group (e.g., a partially or fully halogen substituted $C_1$-$C_{10}$ alkyl group) and $L^3$ to $L^6$ are independently selected from the group consisting of an unsubstituted or substituted carbon atom, an oxygen atom, a sulfur atom, a —(C=O)— group, a —[S(=O)$_2$]— group and a —(S=O)— group,

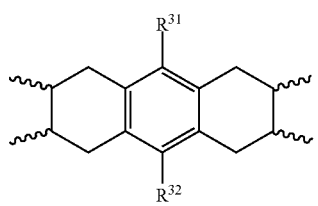

Structure (VI-a)

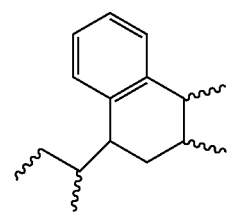

Structure (VI-b)

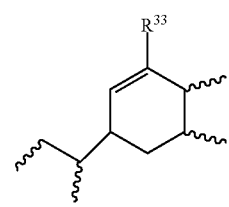

Structure (VI-c)

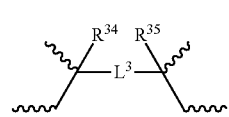

Structure (VI-d)

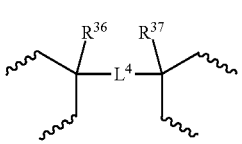

Structure (VI-e)

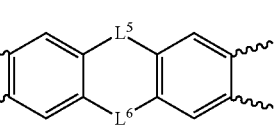

Structure (VI-f)

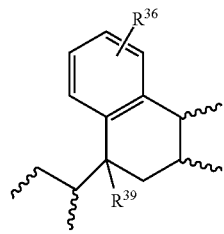

Structure (VI-g)

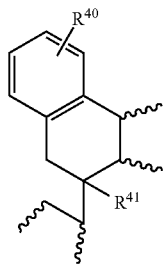

Structure (VI-h)

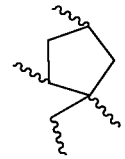

Structure (VI-i)

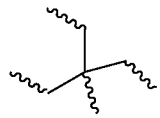

Structure (VI-j)

e) a tetravalent group [$D^1$-$L^1$-$D^2$] where, $D^1$ and $D^2$ are independently selected from the group consisting of:
 1. a substituted or unsubstituted $C_5$-$C_{18}$ monocyclic or polycyclic aliphatic group, and
 2. a substituted or unsubstituted $C_6$-$C_{18}$ mononuclear or polynuclear aromatic group, and $L^1$ is a divalent linking group selected from the group consisting of:
 1. a single bond,
 2. a substituted or unsubstituted $C_1$-$C_{20}$ linear, branched, monocyclic or polycyclic alkylene group,
 3. a substituted or unsubstituted $C_2$ alkenylene group,
 4. a $C_2$ alkynylene group,
 5. a substituted or unsubstituted $C_6$-$C_{18}$ mononuclear or fused polynuclear aromatic group,
 6. an oxygen atom,
 7. a sulfur atom,
 8. a -(C=O)— group,
 9. a -[S(=O)$_2$]— group,
 10. a -(S=O)— group,
 11. a -[C(=O)O]— group,
 12. a -[C(=O)NH]— group, and
 13. a -[O(C($R^{61}$)$_2$(C$R^{62}$)$_2$O)$_{n3}$]— group, where n3 ranges from 1 to about 6 and
 $R^{61}$ and $R^{62}$ are independently a hydrogen atom or a substituted or unsubstituted $C_1$-$C_6$ linear, or branched alkyl group (e.g., a partially or fully halogen substituted $C_1$-$C_6$ alkyl group).

Examples of divalent linking groups $L^1$ include, but are not limited to, those shown below of which each of n3, n4 and n5, independently, has the same meaning defined above:

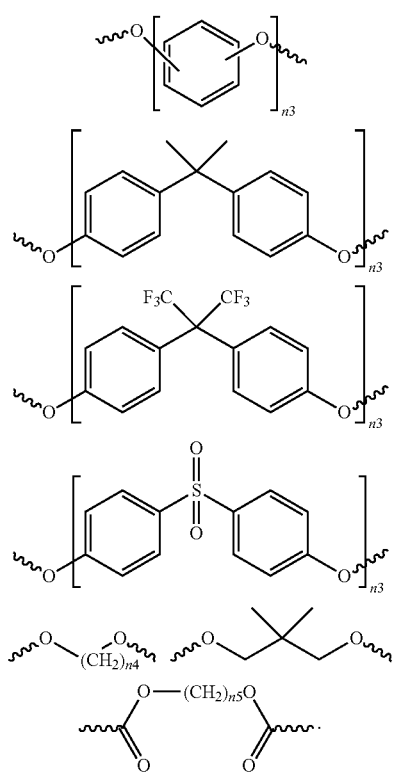
Suitable examples of Y include, but are not limited to, the following moieties:
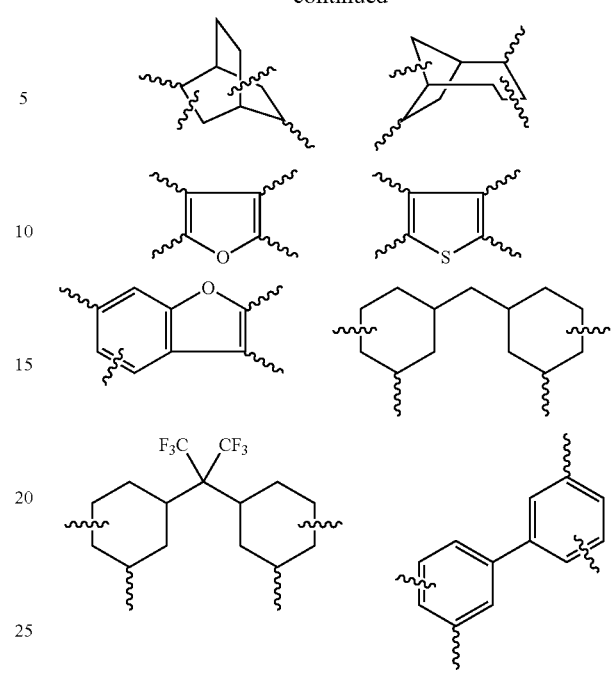
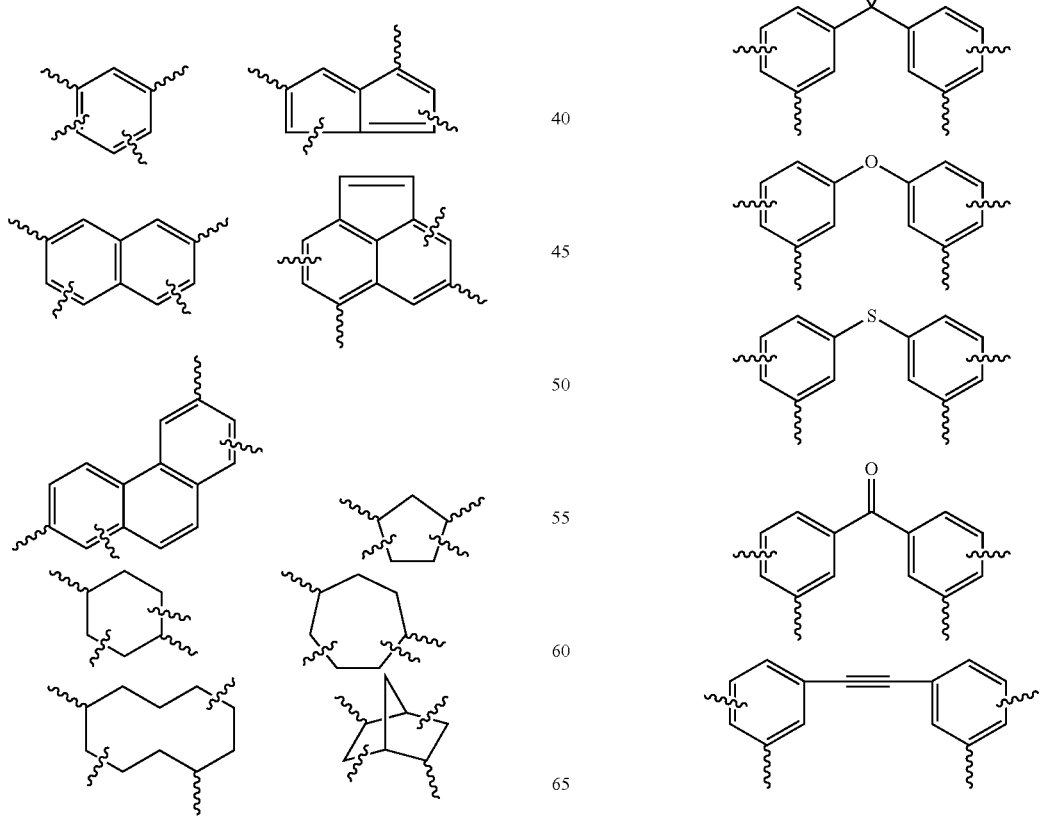

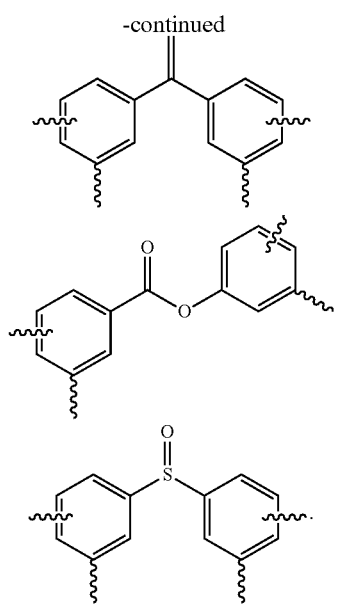

Examples of the tetracarboxylic acid anhydrides include, but are not limited to, 1-(3',4'-dicarboxyphenyl)-1,3,3-trimethylindan-5,6-dicarboxylic acid dianhydride, 1-(3',4'-dicarboxyphenyl)-1,3,3-trimethylindan-6,7-dicarboxylic acid dianhydride, 1-(3',4'-dicarboxyphenyl)-3-methylindan-5,6-dicarboxylic acid dianhydride, and 1-(3',4'-dicarboxyphenyl)-3-methylindan-6,7-dicarboxylic acid anhydride, pyromellitic dianhydride, benzene-1,2,3,4-tetracarboxylic dianhydride, 2,3,5,6-naphthalenetetracarboxylic acid dianhydride, 2,3,6,7-naphthalenetetracarboxylic acid dianhydride, 1,4,5,8-naphthalenetetracarboxylic acid dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-,8,9,10-tetracarboxylic dianhydride, 3,4,9,10-perylenetetracarboxylic acid dianhydride, pyrazine-2,3,5,6-tetracarboxylic dianhydride, thiophene-2,3,4,5-tetracarboxylic dianhydride, 2,3,5,6-pyridinetetracarboxylic acid dianhydride, butane-1,2,3,4-tetracarboxylic acid dianhydride, 1,2,3,4-cyclopentanetetracarboxylic acid dianhydride, cyclobutane-1,2,3,4-tetracarboxylic acid dianhydride, cyclopentane-1,2,3,4-tetracarboxylic acid dianhydride, cyclohexane-1,2,4,5-tetracarboxylic acid dianhydride, norbornane-2,3,5,6-tetracarboxylic acid dianhydride, bicyclo[2.2.2]oct-7-ene-3,4,8,9-tetracarboxylic acid dianhydride, tetracyclo[4.4.1.0$^{2,5}$.0$^{7,10}$]undecane-1,2,3,4-tetracarboxylic acid dianhydride, 3,3',4,4'-benzophenone tetracarboxylic dianhydride, 2,2',3,3'-benzophenone tetracarboxylic dianhydride, 2,3,3',4'-benzophenone tetracarboxylic dianhydride, 3,3',4, 4'-diphenylsulfone tetracarboxylic dianhydride, 2,2',3,3'-diphenylsulfone tetracarboxylic dianhydride, 2,3,3',4'-diphenylsulfone tetracarboxylic dianhydride, 3,3',4,4'-diphenyl ether tetracarboxylic dianhydride, 2,2',3,3'-diphenyl ether tetracarboxylic dianhydride, 2,3,3',4'-diphenyl ether tetracarboxylic dianhydride, 2,2-[bis(3,4-dicarboxyphenyl)] hexafluoropropane dianhydride, ethyleneglycol bis(anhydrotrimellitate), and 5-(2,5-dioxotetrahydro)-3-methyl-3-cyclohexene-1,2-dicarboxylic anhydride.

Examples of preferred tetracarboxylic acid dianhydride monomers include, but are not limited to, 1-(3',4'-dicarboxyphenyl)-1,3,3-trimethylindan-5,6-dicarboxylic acid dianhydride, 1-(3',4'-dicarboxyphenyl)-1,3,3-trimethylindan-6,7-dicarboxylic acid dianhydride, 1-(3',4'-dicarboxyphenyl)-3-methylindan-5,6-dicarboxylic acid dianhydride, and 1-(3',4'-dicarboxyphenyl)-3-methylindan-6,7-dicarboxylic acid anhydride, pyrazine-2,3,5,6-tetracarboxylic dianhydride, thiophene-2,3,4,5-tetracarboxylic dianhydride, 2,3,5,6-pyridinetetracarboxylic acid dianhydride, norbornane-2,3,5,6-tetracarboxylic acid dianhydride, bicyclo[2.2.2]oct-7-ene-3,4,8,9-tetracarboxylic acid dianhydride, tetracyclo[4.4.1.0$^{2.5}$.0$^{7,10}$]undecane-1,2,3,4-tetracarboxylic acid dianhydride, 3,3',4,4'-benzophenone tetracarboxylic dianhydride, 3,3',4, 4'-diphenylsulfone tetracarboxylic dianhydride, 3,3',4,4'-diphenyl ether tetracarboxylic dianhydride, 2,3,3',4'-diphenyl ether tetracarboxylic dianhydride, 2,2-[bis (3,4-dicarboxyphenyl)] hexafluoropropane dianhydride, ethyleneglycol bis(anhydrotrimellitate), and 5-(2,5-dioxotetrahydro)-3-methyl-3-cyclohexene-1,2-dicarboxylic anhydride. More preferred tetracarboxylic acid dianhydride monomers include 3,3',4,4'-benzophenone tetracarboxylic dianhydride, 3, 3',4, 4'-diphenylsulfone tetracarboxylic dianhydride, 3,3',4,4'-diphenyl ether tetracarboxylic dianhydride, 2,3,3',4'-diphenyl ether tetracarboxylic dianhydride, and 2,2-[bis(3,4-dicarboxyphenyl)] hexafluoropropane dianhydride. Any suitable combination of tetracarboxylic acid dianhydride monomers described above in any suitable ratio can be used to form the polyimide polymer describe herein.

In some embodiments, examples of tetracarboxylic acid dianhydride monomers include:

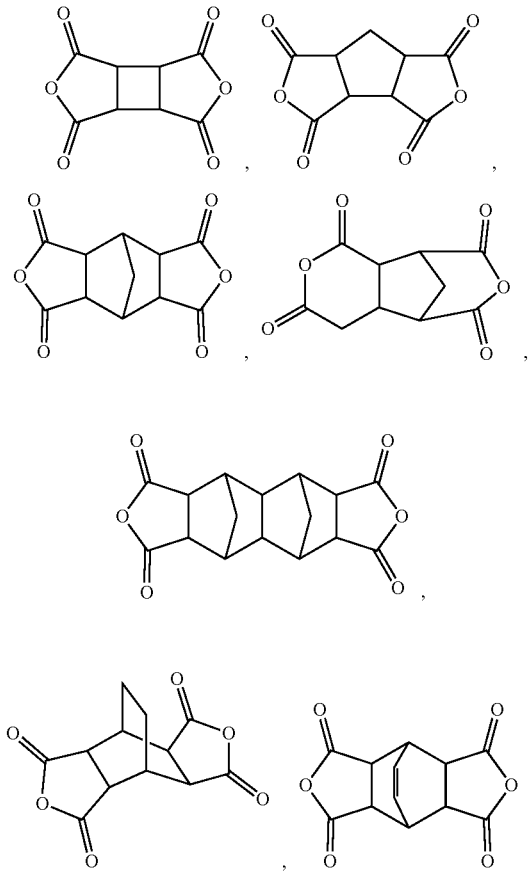

-continued

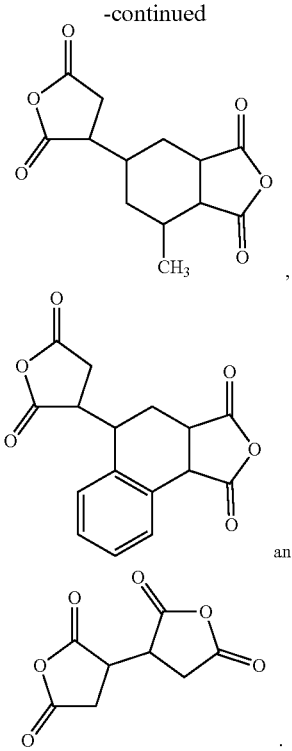

and

In some embodiments, the at least one diamine is selected from the group consisting of a diamine of Structure (Ia) and a diamine of Structure (Ib), and the tetracarboxylic acid dianhydride is selected from the group consisting of pyrazine-2,3,5,6-tetracarboxylic dianhydride, thiophene-2,3,4,5-tetracarboxylic dianhydride, 2,3,5,6-pyridinetetracarboxylic acid dianhydride, norbornane-2,3,5,6-tetracarboxylic acid dianhydride, bicyclo[2.2.2]oct-7-ene-3,4,8,9-tetracarboxylic acid dianhydride, tetracyclo[4.4.1.0$^{2.5}$.0$^{7,10}$]undecane-1,2,3,4-tetracarboxylic acid dianhydride, 3,3',4,4'-benzophenone tetracarboxylic dianhydride, 3,3',4, 4'-diphenylsulfone tetracarboxylic dianhydride, 3,3',4,4'-diphenyl ether tetracarboxylic dianhydride, 2,3,3',4'-diphenyl ether tetracarboxylic dianhydride, 2,2-[bis(3,4-dicarboxyphenyl)] hexafluoropropane dianhydride, ethyleneglycol bis (anhydrotrimellitate), and 5-(2,5-dioxotetrahydro)-3-methyl-3-cyclohexene-1,2-dicarboxylic anhydride.

In some embodiments, the at least one diamine is selected from the group consisting of a diamine of Structure (Ia) and a diamine of Structure (Ib), and the tetracarboxylic acid dianhydride is selected from a group consisting of 3,3',4,4'-benzophenone tetracarboxylic dianhydride, 3,3',4, 4'-diphenylsulfone tetracarboxylic dianhydride, 3,3',4,4'-diphenyl ether tetracarboxylic dianhydride, 2,3,3',4'-diphenyl ether tetracarboxylic dianhydride, and 2,2-[bis(3,4-dicarboxyphenyl)] hexafluoropropane dianhydride.

In some embodiments, the at least one diamine is reacted with at least one tetracarboxylic acid dianhydride to yield a polyamic acid of Structure (VII), where a is an integer ranging from at least 2 (e.g., at least 3, at least 4, at least 5, at least 6, at least 8, at least 10, or at least 15) to at most 500 (e.g., at most 450, at most 400, at most 350, at most 300, at most 250, at most 200, at most 150, at most 100, or at most 50), X is the nucleus of the precursor diamine, and Y is the nucleus of the precursor dianhydride and is defined above. As used herein, when referring to the precursor diamine, "nucleus" refers to the portion of the molecule between the amine functional groups. When referring to the precursor dianhydride, "nucleus" refers to the portion of the molecule between the anhydride functional groups.

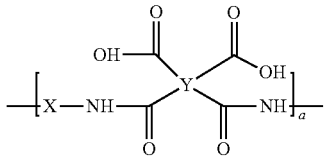

(VII)

The polyamic acid of Structure (VII) can be synthesized by numerous synthetic procedures or variations of those procedures known to those skilled in the art. In general, a polyamic acid of Structure (VII) can be formed through a condensation polymerization reaction between one or more diamines and one or more tetracarboxylic acid dianhydrides. For example, one can bring one or more diamines in contact with one or more tetracarboxylic acid dianhydrides in the presence of a solvent suitable to dissolve the monomers and, preferably, the resultant polyamic acid.

In some embodiments, to prepare a polyamic acid, the diamine component and tetracarboxylic acid dianhydride component are charged into a reaction vessel at the same time or by charging one of the components in the form of a solid or solution into a solution of the other component (complete dissolution of all materials might not occur).

In some embodiments, charging both components at the same time can be advantageous in view of the productivity because the time required for charging is shortened. Generally, the condensation polymerization reaction between the diamine component and tetracarboxylic acid dianhydride component can be carried out at about 15° C. to about 80° C. for about 1 to about 48 hours.

Suitable polymerization solvents useful in the present disclosure include, but are not limited to, N-methyl-2-pyrrolidone, N,N-dimethylformamide, dimethylsulfoxide, gamma-butyrolactone, N,N-dimethylacetamide, tetramethylene sulfone, p-chlorophenol, m-cresol, diethyleneglycol methyl ether, methyl-3-methoxyproprionate, ethyl-3-ethoxypropionate, cyclohexanone, propylene glycol monomethyl ether acetate, and 2-chloro-4-hydroxytoluene. These solvents can be used singly or in combination of two or more. Of these solvents, preferred are N-methyl-2-pyrrolidone, gamma-butyrolactone and N,N-dimethylacetamide, with N-methyl-2-pyrrolidone being more preferred. In some embodiments, a poor solvent for the polyamic acid can be used in combination with these solvents in such an amount to not allow the polyamic acid to precipitate. Examples of such a poor solvent include hexane, heptane, benzene, toluene, xylene, chlorobenzene and o-dichlorobenzene. The amount of the poor solvent to be used is preferably 50 percent by weight or less (inclusive of zero) based on the total amount of the solvents. The polyamic acid thus produced can be isolated by precipitation into a non-solvent or a poor solvent and collected by filtration, followed by further synthetic processes for conversion to a polyimide. In some embodiments, such isolation of the polyamic acid is not required.

In some embodiments, the molar ratio of diamine component(s) to tetracarboxylic acid dianhydride component(s) can be greater than 1.00. The resulting polymer is an amino-terminated polyamic acid (e.g., a polyamic acid of Structure (VIIa)). The molar ratio of diamine component(s) to tetracarboxylic acid dianhydride component(s) can range from 1.01 to 1.40 and can have a direct effect on final molecular weight of polyamic acid and polyimide prepared by imidization of the polyamic acid. In some embodiments, the molar ratio is selected such that the polyamic acid at the end of reaction has a weight average molecular weight (Mw) of at least about 10,000 Daltons (e.g. at least about 20,000 Daltons, at least about 30,000 Daltons, at least about 40,000 Daltons, or at least about 50,000 Daltons) and/or at most about 90,000 Daltons (e.g. at most about 80,000 Daltons, at most about 70,000 Daltons, at most about 60,000 Daltons).

Structure (VIIa)

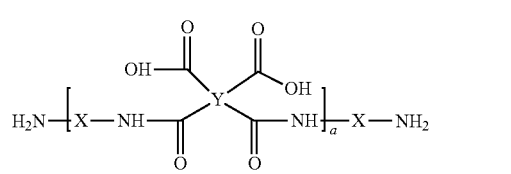

When a molar excess of tetracarboxylic acid dianhydride is employed, an anhydride-terminated polyamic acid (e.g., a polyamic acid of Structure (VIIb)) is produced.

Structure (VIIb)

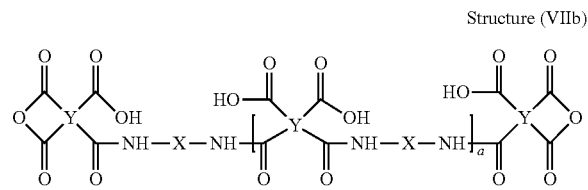

The molar ratio of tetracarboxylic acid dianhydride component(s) to diamine component(s) can range from 0.8 to 0.99 and can have a direct effect on final molecular weight of polyamic acid and polyimide prepared by imidization of the polyamic acid. In some embodiments, the molar ratio is selected such that the polyamic acid at the end of the reaction has a weight average molecular weight (Mw) of at least about 10,000 Daltons (e.g. at least about 20,000 Daltons, at least about 30,000 Daltons, at least about 40,000 Daltons, or at least about 50,000 Daltons) and/or at most about 90,000 Daltons (e.g. at most about 80,000 Daltons, at most about 70,000 Daltons, at most about 60,000 Daltons).

Those skilled in the art will understand that there are multiple synthetic pathways to convert polyamic acids (e.g., those of Structures (VIIa) and (VIIb)) to the polyimide polymers of this disclosure. For example, one pathway is to imidize polyamic acids of Structures (VIIa) and (VIIb) using chemical or thermal imidization techniques to form polyimides of Structure (VIIIa) or (VIIIb).

Structure (VIIIa)

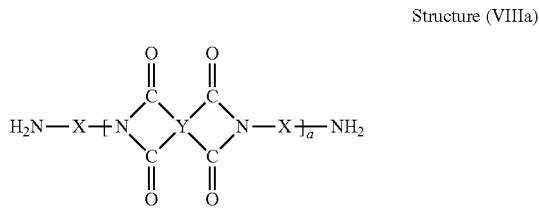

Structure (VIIIb)

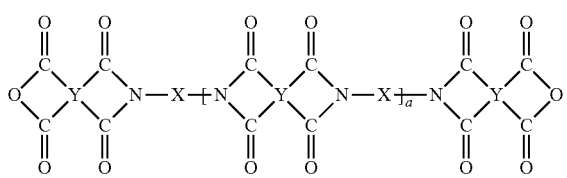

In some embodiments, the polyimide described herein can be end-capped by reaction of the terminal group (e.g., the terminal $NH_2$ in Structure (VIIa) or the terminal anhydride in Structure (VIIIb)) with a compound having a functional group which is reactive with the terminal group and then imidized. Alternatively, the end-capping reaction of the terminal group in Structure (VIIa) or (VIIIb) can be done after the chemical or thermal imidization.

Another synthetic pathway is to include in the polymerization reaction a monoamine or monoanhydride. In such embodiments, the end-capping reaction is performed together with the polymerization reaction.

The thermal imidization can, for example, be performed in the solid state at a temperature ranging from about 100° C. to about 400° C. (e.g., from about 200° C. to about 300° C., or about 250° C.). In another embodiment, the thermal imidization can be performed in a solution at a temperature ranging from about 100° C. to about 250° C. When the heat treatment is performed within this temperature range, the imidization reactivity can be controlled within a desired range, minimizing non-reacted polyamic acid. In some embodiments, the thermal imidization in this manner is best done before reaction of the polymer terminal groups.

The polyamic acid can also be dehydrated in an imidization reaction using an azeotroping thermal procedure. An example of this reaction is described in U.S. Pat. No. 5,478,915. For example, after the synthesis of the polyamic acid is complete, toluene is added, and the solution is azeotropically refluxed at 155° C., collecting the water in a Dean-Stark trap.

In some embodiments, the polyimide of Structure (VIIa) or (VIIIb) is produced by chemical imidization. For example, a chemical imidizing agent (e.g., a dehydrating agent) can be added to the polyamic acid of Structure (VIIa) or (VIIb). This chemical imidization agent can catalyze the ring-closing dehydration process of the polyamic acid groups to form imide functionalities on the polymer backbone. If the polyamic acid is isolated after the synthesis, it can be re-dissolved in a compatible solvent. Normally, when a chemical imidization is employed, the imidization reaction takes place without isolation of the polyamic acid.

A suitable dehydrating agent can be used alone or in combination with a non-nucleophilic base to imidize the polyamic acid. Examples of suitable dehydrating agents include, but are not limited to, trifluoromethane sulfonic acid, methanesulfonic acid, p-toluenesulfonic acid, ethanesulfonic acid, butanesulfonic acid, perfluorobutanesulfonic acid, acetic anhydride, propionic anhydride, and butyric anhydride. If used, the non-nucleophilic base employed can be the same as or different from a non-nucleophilic base employed in the end-capping reaction. Examples of suitable non-nucleophilic bases include, but are not limited to, pyridine, triethylamine, tripropylamine, tributylamine, dicyclohexylmethylamine, 2-methylpyridine, 2,6-lutidine, 3,5-lutidine, 4-picoline, 4-dimethylaminopyridine (DMAP) and the like.

In some embodiments, the chemical imidization process is carried out with a suitable dehydrating agent and a non-nucleophilic base at about 60° C. to about 130° C. for about 6 hours to about 48 hours. The dehydrating agent and non-nucleophilic base can be employed in equimolar concentrations. In another embodiment, the molar ratio of dehydrating agent to non-nucleophilic base is from about 1.1 to about 10 (e.g., from about 1.25 to 5, or from about 1.5 to about 3.0). In one embodiment, about 90 mole % to 200 mole % of a dehydrating agent based on the total amount of the polyamic acid present in the mixture is used to complete the imidization reaction. In some embodiments, 100 mole % to 160 mole % of a dehydrating agent is used to complete the imidization process.

Imidization to form a polyimide of Structure (VIIa) or (VIIIb) can be confirmed by observation of characteristic absorptions in the infrared spectrum from 1770 and 1700 $cm^{-1}$ attributable to the imide ring structure.

The terminal $NH_2$ groups of the polymers of Structures (VIIa) and (VIIa) can be optionally end-capped by reaction with an end-capping compound having a functional group which is reactive to an amine. Examples of such end-capping compounds include, but are not limited to, acid chloride compounds, dicarboxylic acid anhydrides, epoxide compounds, and isocyanate compounds. In some embodiments, end-capping compounds can be those containing at least one second functional group selected from a substituted or unsubstituted alkenyl group (e.g., a $C_2$-$C_6$ linear alkenyl group) and a substituted or unsubstituted alkynyl group (e.g., a $C_2$-$C_6$ linear alkynyl group). Examples of substituted alkenyl groups include, but are not limited to, acrylates, methacrylates, stilbenes, and vinyl ethers. Examples of substituents on alkynyl groups include, but are not limited to, alkyl (e.g., Me or Et), aryl (e.g., phenyl or substituted phenyl), alkanoyl (e.g., acetyl) and aroyl (e.g., benzoyl).

Examples of end-capping compounds having a functional group reactive to the terminal $NH_2$ groups that also have at least one second functional group selected from a substituted or unsubstituted alkenyl group and a substituted or unsubstituted alkynyl group include, but are not limited to, the following compounds:

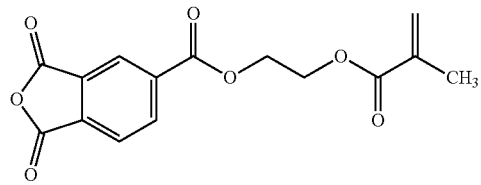

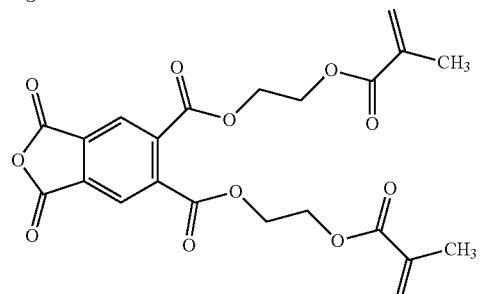

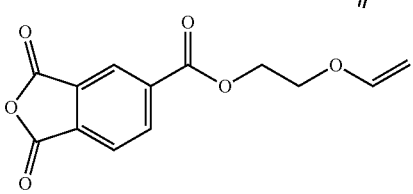

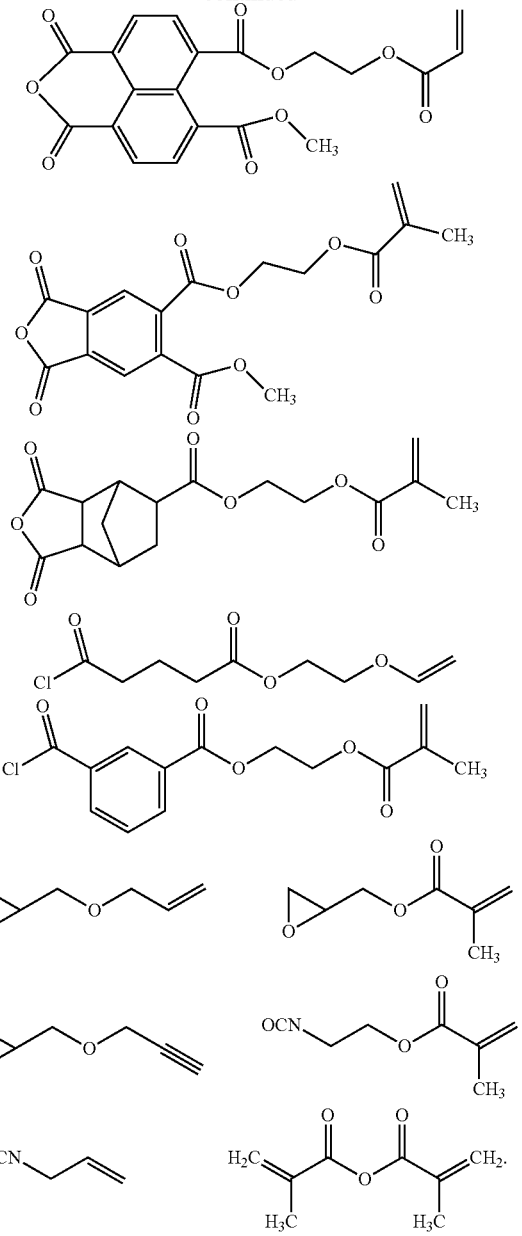

When anhydrides are employed as the reactive functional group to end-cap the polymers of Structures (VIIa) and (VIIa), end groups containing amic acids are produced. Polyamic acids terminating polymers of Structure (VIIa) can be imidized when the backbone polyamic acids are imidized. When monoanhydrides are employed as the reactive functional group to end-cap an amino-terminated polyimide, the terminated group will be a polyamic acid. These terminal polyamic acids can imidize spontaneously or during isolation and drying, or can easily be imidized with mild heat or with a minimal of dehydrating agent.

In some embodiments, the monoanhydride suitable for preparing the end capped polyamic acids or polyimides contains a "masked" maleic anhydride group, which after conversion of the anhydride group to an imide group, becomes a "masked" maleimide group. This terminal imide group is able to undergo a cycloreversion reaction (e.g., a retro-Diels-Alder reaction) to unmask the maleimide group.

A polyimide polymer containing maleimide groups as end-cap groups can react with a reactive functional compound (RFC) (e.g., a compound containing at least two thiol groups) to form a cross-linked polyimide.

Examples of monoanhydrides that can undergo a cyclo-reversion reaction include, but are not limited to, compounds described by Structure IX:

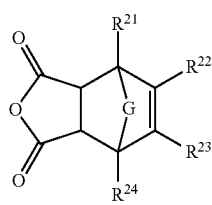

Structure IX where G is —O—, —(NR$^{25}$)—, —[C(R$^{26}$)=C(R$^{27}$)]—, or —[C=C(R$^{28}$)$_2$]—, in which each of R$^{25}$, R$^{26}$, R$^{27}$, and R$^{28}$, independently, is H, a substituted or unsubstituted C$_1$-C$_{12}$ linear, branched, monocyclic or polycyclic alkyl group, or a substituted or unsubstituted phenyl group, and each of R$^{21}$, R$^{22}$, R$^{23}$ and R$^{24}$, independently, is H, a substituted or unsubstituted C$_1$-C$_{12}$ linear, branched, monocyclic or polycyclic alkyl group, a substituted or unsubstituted phenyl group, OR$^{29}$, CH$_2$OR$^{30}$, CH$_2$OC(=O)R$^{31}$, CH$_2$C(=O)OR$^{32}$, CH$_2$NHR$^{33}$, CH$_2$NHC(=O)R$^{34}$, CH$_2$C(=O)N(R$^{35}$)$_2$, C(=O)OR$^{36}$, in which each of R$^{29}$, R$^{30}$, R$^{31}$, R$^{32}$, R$^{33}$, R$^{34}$, R$^{35}$ and R$^{36}$, independently, is H or a substituted or unsubstituted C$_1$-C$_6$ linear, branched, or monocyclic alkyl group.

Examples of specific suitable monoanhydrides of Structure IX include, but are not limited to, the following compounds:

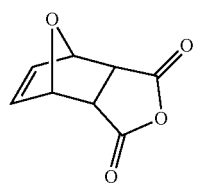
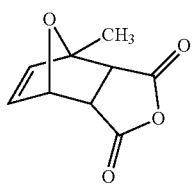
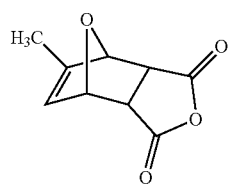
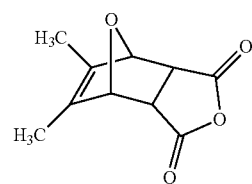
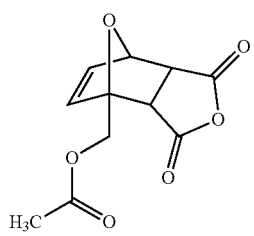
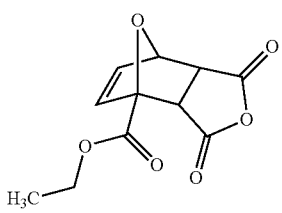

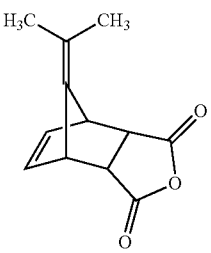
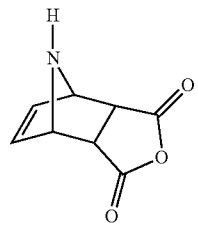
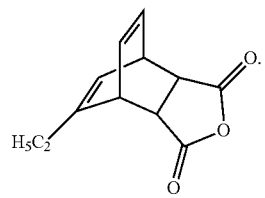

Other examples of monoanhydrides of Structure IX have been described, for example, in U.S. Application Publication No. 2014-0343199, the contents of which are hereby incorporated by reference.

The terminal anhydride groups of the anhydride terminated polymers of Structures (VIIb) and (VIIIb) can be optionally end-capped by reaction with a compound having a functional group which is reactive with an anhydride. Examples of such functional groups include, but are not limited to, amino, hydroxyl, and thiol groups. In some embodiments, end-capping compounds are those having at least one second functional group selected from a substituted or unsubstituted alkenyl group and a substituted or unsubstituted alkynyl group.

Examples of end-capping compounds containing reactive groups include, but are not limited to, the following compounds:

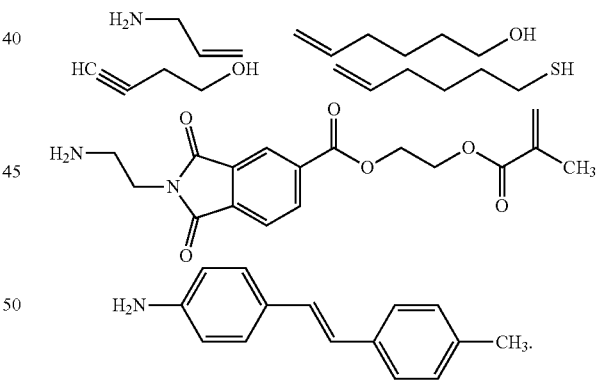

In some cases, a non-nucleophilic base can be used to facilitate the reaction between end-capping compounds and the terminal anhydride groups. Examples of suitable non-nucleophilic bases include, but are not limited to, pyridine, triethylamine, tripropylamine, tributylamine, dicyclohexylmethylamine, 2-methylpyridine, 2,6-lutidine, 3,5-lutidine, 4-picoline, 4-dimethylaminopyridine (DMAP) and the like.

When the anhydride terminated polymers of Structures (VIIb) and (VIIIb) are end-capped with an amine containing compound, end groups containing amic acids are produced. In this situation, when the polyamic acids are imidized, the endcap is imidized as well. The polyamic acid resulting from the end-capping of anhydride terminated polyimides of Structure (VIIIb) with an amine containing compound can be isolated. Alternatively, the terminal polyamic acid can be imidized thermally or chemically during or after the formation of the polyimide.

In some embodiments, the resulting polyim ides of the present disclosure can be isolated by precipitation into water and/or an organic solvent, recovered by filtration, and dried. In another embodiment, the polyimide of the present disclosure can be isolated by addition of its solution to a combination of water and a suitable water-immiscible solvent. Because of the lower polarity nature of the monomer moieties in the polyimide polymer, higher solubility in lower polarity water immiscible solvents allows the polyimide of this disclosure, unlike most polyim ides, to be extracted from the higher polarity reaction solvent/water mixture. This extracted polymer solution can be purified by washing with water followed by separation of the water layer, distillation of various volatile compounds, and subsequent extraction into a higher boiling solvent.

The reactive functional compound (RFC) (component B) in the photosensitive polymeric composition or the photosensitive polymeric layer generally helps generate a contrast in the dissolution rate of the film prepared from the photosensitive composition described herein before and after exposure. In some embodiments, the RFC possesses at least one (e.g., at least two or at least three) functional groups capable of reacting with other RFC compounds or with the optional terminal functional group on the polyimide polymer (e.g., the second functional group of the end-capping reagent, which becomes a part of the polyimide polymer described above after the end-capping reaction). The RFC can be a monomer or an oligomer. The oligomer can contain two or more monomer units and is capable of further reactions to be incorporated in the final polyimide polymer. Examples of such monomer units/oligomers are based on one or more of the following types: (meth)acrylates, esters, vinyl compounds (e.g., vinyl alcohol), urethanes, ureas, imides, amides, carboxazoles, carbonates, pyranoses, siloxanes, urea-formaldehydes and melamine-formaldehydes. As used herein, the term "(meth)acrylate" include both acrylate compounds and methacrylate compounds. In some embodiments, the RFC contains at least one terminal and/or pendant reactive functional group capable of radical, or thermal reaction with the at least one second functional group. In one embodiment, the reactive functional group on the RFC includes a double or triple bond.

Suitable examples of reactive functional groups on the RFC include, but are not limited to, a vinyl group, an allyl group, a vinyl ether group, a propenyl ether group, a (meth)acryloyl group, a —SiH group and a —SH (thiol) group.

In one embodiment, a suitable example of an RFC includes, but is not limited to, an urethane acrylate oligomer. The term "urethane acrylate oligomer" refers to a class of compounds that contain urethane linkages and have (meth) acrylate (e.g., acrylate or methacrylate) functional groups such as urethane multi(meth)acrylate, multiurethane (meth) acrylate, and multiurethane multi(meth)acrylate. Types of urethane (meth)acrylate oligomers have been described by, for example, Coady et al., U.S. Pat. No. 4,608,409 and by Chisholm et al., U.S. Pat. No. 6,844,950. Other specific examples of RFC include 1,6-hexanediol di(meth)acrylate, tetraethyleneglycol di(meth)acrylate, divinylbenzene, ethoxylated bisphenol-A-di(meth)acrylate, diethylene glycol bis(allyl carbonate), trimethylolpropane tri(meth)acrylate, ditrimethylolpropane tetra(meth)acrylate, pentaerythritol tri(meth)acrylate, pentaerythritol tetra(meth)acrylate, dipentaerythritol penta-/hexa-(meth)acrylate, isocyanurate tri(meth)acrylate, bis(2-hydroxyethyl)-isocyanurate di(meth)acrylate, 1,3-butanediol tri(meth)acrylate, 1,4-butanediol tri(meth)acrylate, methyl (meth)acrylate, butyl (meth)acrylate, cyclohexyl (meth)acrylate, benzyl(meth)acrylate, neopentyl glycol di(meth)acrylate, (meth)acrylate modified-urea-formaldehyde resins, (meth)acrylate modified melamine-formaldehyde resins and (meth)acrylate modified cellulose.

Examples of RFC compounds containing thiol groups include, but are not limited to, trimethylolpropane tris(mercaptoacetate), pentaerythritol tetrakis(mercaptoacetate), dipentaerythritol hexakis(3-mercaptopropionate), and ethoxylated trimethylolpropane tri-3-mercaptopropionate. Examples of RFC compounds containing vinyl ether groups include, but are not limited to, 1,4-butanediol divinyl ether, 1,4-cyclohexanedimethanol divinyl ether, di(ethylene glycol) vinyl ether, poly(ethylene glycol)divinyl ether, and bis[4-(vinyloxy)butyl] (4-methyl-1,3-phenylene)biscarbamate. One example of a RFC compound containing a SiH group is octasilane POSS® SH1310 available from Hybrid Plastics.

In some embodiments, a photoinitiator (i.e., component (C)) in the photosensitive polymeric composition or the photosensitive polymeric layer of the dry film structure is a compound capable of initiating a reaction between the functional groups of the reactive functional compound (RFC) or between a functional group of an RFC and the second functional group of optionally end-capped polymers, when the composition, or a portion of the composition, is exposed to actinic radiation. Some photoinitiators used in the composition function by generating free radicals after absorbing light at the wavelength of exposure.

Specific examples of initiators that generate free radicals when exposed to high energy radiation (also known as photoinitiators) include, but are not limited to, NCl-831 (Available from ADEKA Corp.), 1,8-bis[9-(2-ethylhexyl)-6-nitro-9H-carbazol-3-yl]-1,8-bis(O-acetyloxime), 2-hydroxy-2-methyl-1-phenylpropan-1-one, 1-hydroxycyclohexyl phenyl ketone (Irgacure 184 from BASF), a blend of 1-hydroxycyclohexylphenylketone and benzophenone (Irgacure 500 from BASF), 2,4,4-trimethylpentyl phosphine oxide (Irgacure 1800, 1850, and 1700 from BASF), 2,2-dimethoxyl-2-acetophenone (Irgacure 651from BASF), bis (2,4,6-trimethyl benzoyl)phenyl phosphine oxide (Irgacure 819 from BASF), 2-methyl-1-[-4-(methylthio)phenyl]-2-morphorinopropane-1-on (Irgacure 907 from BASF), (2,4, 6-trimethylbenzoyl)diphenyl phosphine oxide (Lucerin TPO from BASF), ethoxy(2,4,6-trimethylbenzoyl)phenyl phosphine oxide (Lucerin TPO-L from BASF), a blend of phosphine oxide, hydroxy ketone and a benzophenone derivative (ESACURE KTO46 from Sartomer), 2-hydroxy-2-methyl-1-phenylpropane-1-on (Darocur 1173 from Merck), benzophenone, 2-chlorothioxanthone, 2-methylthioxanthone, 2-isopropylthioxanthone, benzodimethyl ketal, 1,1,1-trichloroacetophenone, diethoxyacetophenone, m-chloroacetophenone, propiophenone, anthraquinone, dibenzosuberone and the like.

Specific examples of nonionic-type photoinitiators are (5-toluylsulfonyloxyimino-5H-thiophen-2-ylidene)-2-methylphenyl-acetonitrile(Irgacure 121 from BASF), phenacyl p-methylbenzenesulfonate, benzoin p-toluenesulfonate, (p-toluene-sulfonyloxy)methylbenzoin, 3-(p-toluenesulfonyloxy)-2-hydroxy-2-phenyl-1-phenylpropyl ether, N-(p-dodecylbenzenesulfonyloxy)-1,8-naphthalimide, N-(phenyl-sulfonyloxy)-1,8-napthalimide, bis(cyclohexylsulfonyl) diazomethane, 1-p-toluenesulfonyl-1- cyclohexylcarbonyldiazomethane, 2-nitrobenzyl p-toluenesulfonate, 2,6-dinitrobenzyl p-toluenesulfonate, and 2,4-dinitrobenzyl p-trifluoromethylbenzenesulfonate and the like.

Alternatively, a combination of a photosensitizer and an initiator (e.g., an initiator not activated by actinic radiation) may be used in the photosensitive composition. In this alternative, a photosensitizer absorbs the light and transfers energy to the initiator to start reactions with the RFC. Examples of photosensitizers include, but are not limited to, 9-methylanthracene, anthracenemethanol, acenaphthylene, thioxanthone, methyl-2-naphthyl ketone, 4-acetylbiphenyl, and 1,2-benzofluorene.

Specific examples of initiators that can be activated by a sensitizer include, but are not limited to, benzoyl peroxide, cyclohexanone peroxide, lauroyl peroxide, tert-amyl peroxybenzoate, tert-butyl hydroperoxide, dicumyl peroxide, cumene hydroperoxide, succinic acid peroxide, di(n-propyl) peroxydicarbonate, 2,2-azobis(isobutyronitrile), 2,2-azobis (2,4-dimethylvaleronitrile), dimethyl-2,2-azobisisobutyrate, 4,4-azobis(4-cyanopentanoic acid), azobiscyclohexanecarbonitrile, 2,2-azobis(2-methylbutyronitrile) and the like.

In some embodiments, the photosensitive polymeric composition described herein can include at least one organic solvent. Suitable examples of organic solvents include, but are not limited to, gamma-butyrolactone (GBL), N-methyl-2-pyrrolidone (NMP), dimethylimidazolidinone, N-methyl-caprolactam, N-methylpropionamide, N,N-dimethylacet-amide (DMAc), dimethyl sulfoxide (DMSO), N,N-dimethylformamide (DMF), N,N-diethylfornamide, diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol 1,4:3,6-dianhydrosorbitol, 2,5-dimethyl ether (2,5-dimethylisosorbide), 1,4:3,6-dianhydrosorbitol 2,5-diethyl ether (2,5-diethylisosorbide) and mixtures thereof. Preferred solvents are gamma-butyrolactone (GBL), cyclopentanone (CP), cyclohexanone, isosorbide dimethyl), ethyl lactate (EL) and dimethylsulfoxide (DMSO). These solvents can be used individually or in combination.

In general, the polyimide polymer described herein can be soluble in the organic solvent described above. In some embodiments, the polyimide polymer can have a solubility in one of the organic solvents described in the preceding paragraph of at least about 50 mg/mL (e.g., at least about 100 mg/mL or at least about 200 mg/mL) at 25° C.

In some embodiments, the photosensitive polymeric layer can optionally include at least one solvent. The solvent in the photosensitive polymeric layer can be the residual of the solvent in the photosensitive polymeric composition described above. In general, the amount of solvent in the photosensitive polymeric layer of the dry film of this disclosure depends on drying time and temperature. In some embodiments, the amount of solvent is at least about 0.5 weight % (e.g., at least about 1 weight %, at least about 2 weight %, at least about 3 weight %, at least about 4 weight %, or at least about 4.5 weight %) and/or at most about 20 weight % (e.g., at most about 17 weight %, at most about 14 weight %, at most about 11 weight %, at most about 8 weight %, or at most about 5 weight %) of the entire weight of the photosensitive polymeric layer of dry film.

The photosensitive polymeric layer can have a thickness from at most about 5 μm (e.g., at most about 4 μm, or at most about 3 μm) to at least about 1 μm (e.g., at least about 2 μm, or at least about 3 μm).

In some embodiments, the amount of polyimide (component (A)) is at least about 5 weight % (e.g., at least about 10 weight %, at least about 20 weight %, at least about 30 weight %, or at least about 40 weight %) and/or at most about 95 weight % (e.g., at most about 90 weight %, at most about 85 weight %, at most about 80 weight %, or at most about 75 weight %) of the entire weight of the photosensitive polymeric composition.

In some embodiments, the amount of component (B) (RFC) having at least one reactive functional group is at least about 1 weight % (e.g., at least about 4 weight %, at least about 8 weight %, at least about 12 weight %, at least about 16 weight %, or at least about 20 weight %) and/or at most about 50 weight % (e.g., at most about 45 weight %, at most about 40 weight %, at most about 35 weight %, or at most about 30 weight %) of the entire weight of the photosensitive polymeric composition.

In some embodiments, the amount of reactive functional compound (RFC) is at most about 60 wt % (e.g., at most about 55 wt %, at most about 50 wt %, at most about 45 wt %, at most about 40 wt %, or at most about 35 wt %) of the amount of the polyimide polymer. If the amount of reactive functional compound (RFC) is higher than about 60 wt % of the amount of the polyimide polymer, it is believed that the mechanical properties as well as chemical resistance of the film made from such a dry film can suffer and coating defects and tackiness of film due to lower viscosity can be observed.

In some embodiments, the amount of reactive functional compound (RFC) is at least about 10 wt % (e.g., at least about 15 wt %, at least about 20 wt %, at least about 25 wt %, or at least about 30 wt %) of the amount of the polyimide polymer. If the amount of reactive functional compound (RFC) is less than about 10 wt % of the amount of the polyimide polymer, it is believed that there can be poor contrast between exposed and unexposed areas of the film made from such a dry film and lithographic performance of the film will suffer greatly.

In some embodiments, the amount of component (C) (photoinitiator) is at least about 0.0001 weight % (e.g., at least about 0.01 weight %, at least about 0.1 weight %, or at least about 1 weight %) and/or at most about 10 weight % (e.g., at most about 7 weight %, at most about 5 weight %, or at most about 3 weight %) of the entire weight of the photosensitive polymeric composition.

The photosensitive polymeric composition or the photosensitive polymeric layer of the dry film structure of this disclosure may optionally contain other additives including, but not limited to, adhesion promoters, surfactants, nanoparticles, and plasticizers. The amounts of these additional additives can range from 0 wt % to about 15 wt % based on the entire weight of the photosensitive polymeric composition or the photosensitive polymeric layer.

Suitable adhesion promoters are described in "Silane Coupling Agent" Edwin P. Plueddemann, 1982 Plenum Press, New York. Classes of adhesion promoters include, but are not limited to, vinylalkoxysilanes, methacryloxy-alkoxyysilanes (e.g., 3-methacryloxypropyldimethoxymethylsilane, and 3-methacryloxypropyltrimethoxysilane), mercaptoalkoxysilanes, aminoalkoxysilanes, epoxyalkoxysilanes and glycidyloxyalkoxysilanes. Examples of suitable adhesion promoters include, but are not limited to, gamma-aminopropyltrimethoxysilane, gamma-glycidyloxypropylmethyldimethoxysilane, gamma-glycidyloxypropyl-methyldiethoxysilane, glycidyloxypropyltrimethoxysilane, and gamma-mercaptopropyl-methyldimethoxysilane.

In some embodiments, the adhesion promoter contains a silicon compound without a thiol group. In some embodiments, the adhesion promoter contains a silicon compound without an acrylic moiety. In some embodiments, the adhesion promoter contains a silicon compound without an epoxy group.

The concentration of the optional adhesion promoter, if employed, ranges from at least about 0.1% by weight (e.g., at least about 0.2% by weight or at least about 0.3% by weight) to at most about 5% by weight (e.g., at most about 1.5% by weight or at most about 1% by weight) of the polymeric composition.

The photosensitive polymeric composition or the photosensitive polymeric layer of the dry film structure of this disclosure can also optionally contain at least one surfactant. If a surfactant is employed, it can be added from at least about 0.001% by weight (e.g., at least about 0.05% by weight or at least about 0.1% by weight) to at most about 2% by weight (e.g., at most about 1.5% by weight or at most about 1% by weight) of the first polymeric layer compositions. Examples of suitable surfactants include, but are not limited to, the surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988.

The photosensitive polymeric composition or the photosensitive polymeric layer of the dry film structure of the present disclosure can optionally contain at least one plasticizer. The amount of the optional plasticizer, if employed, can range from at least about 1% by weight (e.g., at least about 1.5% by weight or at least about 2% by weight) to at most about 20% by weight (e.g., at most about 10% by weight or at most about 5% by weight) of the first polymeric layer composition.

In some embodiments, the photosensitive polymeric composition or the photosensitive polymeric layer of the dry film structure of this disclosure can further include at least one nanoparticle (e.g., a plurality of nanoparticles). The nanoparticle can be made from one or more polymers, inorganic materials, and/or metals. The nanoparticles suitable for this application are preferably less than 200 µm in diameter and are compatible with the other components of the compositions of this disclosure. Examples of such nanoparticles are found, e.g., in U.S. Pat. Nos. 6,291,070 and 6,844,950, the contents of which are hereby incorporated by reference. Without wishing to be bound by theory, it is believed that the nanoparticles can improve the mechanical properties (e.g., CTE) and electrical properties (e.g., dielectric properties) of the polymeric layer of the dry film structure made by such photosensitive compositions.

Examples of nanoparticles include silica, alumina, titania, zirconia, hafnium oxide, CdSe, CdS, CdTe, CuO, zinc oxide, lanthanum oxide, niobium oxide, tungsten oxide, strontium oxide, calcium titanium oxide, sodium titanate, and potassium niobate. The nanoparticles can be surface treated or untreated nanoparticles.

In some embodiments, the photosensitive compositions of the present disclosure include one or more additional polymers which form a continuous phase with the polyimide polymer described above. Suitable examples of the additional polymers include, but are not limited to, polyamic acids, polyamic esters, polyesters, polyamides, polyhydroxyamides, polyetherimides, polyarylenes, polyethers and polyarylsulfides. These additional polymers may contain reactive groups (e.g. unsaturated groups) at their termini and/or along their backbone. In some embodiments, the additional polymer is added in amounts of from at least about 0.5 weight % (e.g., at least about 1 weight % or at least about 5 weight %) to at most about 20 weight % (e.g., at most about 15 weight % or at most about 10 weight %) relative to the polyimide polymer(s). In some embodiments, the compositions of the present disclosure are substantially free of a polymer which forms a discontinuous phase with the polyimide polymer described above.

In some embodiments, this disclosure features methods of preparation of a dry film structure. The method includes: (a) coating a carrier substrate with a photosensitive polymeric composition described herein to form a coated composition, (b) drying the coated composition to form a photosensitive polymeric layer, and (c) optionally applying a protective layer to the photosensitive polymeric layer to form a dry film structure.

In some embodiments, the carrier substrate is a single or multiple layer film, which optionally has undergone treatment to modify the surface of the film that will contact the photosensitive polymeric layer of the dry film structure. In some embodiments, one or more layers of a multilayer carrier substrate can contain particles. Examples of particles include, but are not limited to, inorganic particles such as silicon dioxide particles (aggregated silica and the like), calcium carbonate particles, alumina particles, titanium oxide particles, and barium sulfate particles; organic particles such as crosslinked polystyrene particles, acrylic particles, and imide particles; and their mixtures. Without wishing to be bound by theory, it is believed that the particles can improve the adhesion properties of the carrier substrate, and can improve the uniformity of the photosensitive polymeric layer coated on the carrier substrate.

In some embodiments, the carrier substrate has excellent optical transparency and is substantially transparent to actinic irradiation used to form a relief pattern in the photosensitive polymeric layer. In some embodiments, the carrier substrate can possess low surface roughness. The carrier substrate in general should be sufficiently strong and they should be insoluble in the solvent used to form the polymeric layer. The carrier substrate can be removed from the remainder of the dry film structure (e.g., the photosensitive polymeric layer) in subsequent use, or can form part of the final structure of the fabricated device. In situations where the carrier substrate is eventually removed from the final device, such as by peeling, adhesion between the carrier substrate and the photosensitive polymeric layer should be weak enough to allow for ease of separation. In such embodiments, the carrier substrate can include a release layer on the surface to be coated by the photosensitive polymeric layer to facilitate removal of the carrier substrate. In cases in which the carrier substrate is part of the final device, adhesion should be high to prevent peeling of the carrier substrate.

As specific examples of the carrier substrate, there may be various plastic films such as polyethylene terephthalate (PET), polyethylene naphthalate, polypropylene, polyethylene, cellulose tri-acetate, cellulose di-acetate, poly(metha) acrylic acid alkyl ester, poly(metha)acrylic acid ester copolymer, polyvinylchloride, polyvinyl alcohol, polycarbonate, polystyrene, cellophane, polyvinyl chloride copolymer, polyamide, polyimide, vinyl chloride-vinyl acetate copolymer, polytetrafluoroethylene, polytrifluoroethylene, and the like. In addition, a combination material containing two or more plastic films or two or more polymers can be used. Polyethylene terephthalate (PET) film having excellent optical transparency is particularly preferable. The thickness of the carrier substrate can be in the range of at least about 10 μm (e.g., at least about 15 μm, at least about 20 μm, at least about 30 μm, at least about 40 μm, at least about 50 μm or at least about 60 μm) to at most about 150 μm (e.g., at most about 140 μm, at most about 120 μm, at most about 100 μm, at most about 90 μm, at most about 80 μm, or at most about 70 μm). The Young's modulus of the carrier substrate can be in the range of at least about 100 MPa (e.g., at least about 150 MPa, at least about 200 MPa, or at least about 250 MPa) to at most about 500 MPa (e.g., at most about 450 MPa, at most about 400 MPa, or at most about 350 MPa).

The carrier substrate can be used with or without corona treatment. Corona is ionized air created by discharging high frequency high voltage energy across a metal or insulated electrode. This electrode is positioned over a grounded roll. The corona treatment of films can optimize surfaces for adhesion by removing surface contaminants, creating bonding sites and raising the surface energy. In some embodiments, corona treatment can be done during winding of the carrier substrate film to form a roll by passing the film through a corona process. This produces pretreated corona film. Such corona treated carrier substrate films are commercially available. Another option is "online corona treatment" where the carrier substrate film is passed through a corona chamber just before coating of the photosensitive polymeric layer composition onto the carrier substrate. On line corona treatment of carrier substrates can improve print quality, eliminates pinholing in coating, and increases dry film structure productivity.

The coating method to form the photosensitive polymeric layer of the dry film structure is not particularly limited. For example, methods such as spray coating, roll coating, rotation coating, slit coating, compression coating, curtain coating, die coating, wire bar coating, and knife coating can be used to form the photosensitive polymeric layer. The drying temperature used to form the photosensitive polymeric layer can vary according to the components, the organic solvent, and the content ratio. In some embodiments, drying is carried out at a temperature of at least about 60° C. (e.g., at least about 65° C., at least about 70° C. or at least about 75° C.) to at most about 120° C. (e.g., at most about 105° C., at most about 90° C. or at most about 85° C.) for at least about 30 seconds (e.g., at least about 1 minute, at least about 2 minutes, at least about 4 minutes or at least about 6 minutes) to at most about 15 minutes (e.g., at most about 12 minutes, at most about 10 minutes, or at most about 8 minutes). An example of the drying means is a convection oven using hot air, but any suitable heating means can be employed.

In some embodiments, melt viscosity and melting point can be important thermal properties of the above described photosensitive polymeric layer. Both of these properties can be critical for effective lamination of the dry film structure onto a substrate.

In some embodiments, the dry film structure contains a photosensitive polymeric layer having a melt viscosity of at least about 10 poise (e.g., at least about 20 poise, at least about 30 poise, at least about 40 poise or at least about 50 poise) and/or at most about 150 poise (e.g., at most about 140 poise, at most about 130 poise, at most about 120 poise, at most about 110 poise, at most about 100 poise or at most about 90 poise) at a temperature from about 60° C. to about 140° C. Without wishing to be bound by theory, it is believed that, when melt viscosity of the photosensitive polymeric layer is too low, over-flowing of the photosensitive polymeric layer can occur during lamination. This results in inconsistent film thickness of the laminated film and contamination of the backside of substrate. When the melt viscosity is too high, polymer flow can be unusually slow which results in voids and air-bubbles in the layer thus formed. Moreover, if the carrier substrate is patterned, low polymer flow can cause incomplete and improper filling of the patterns.

In some embodiments, the photosensitive polymeric layer has a melting point of at least about 60° C. (e.g., at least 65° C., at least about 70° C., at least about 75° C., or at least about 80° C.) and/or at most about 140° C. (e.g. at most about 135° C., at most about 130° C., at most about 125° C., or at most about 120° C.). Without wishing to be bound by theory, it is believed that, when the melting point of the photosensitive polymeric layer is too low, formation of a dry film can be hindered to such a degree that the formation of the dry film stack, typically by a continuous process, is hindered. When the melting point is too high, a high temperature is needed during lamination of the photosensitive polymeric layer and the carrier substrate and can cause the carrier substrate to be melted, thereby ruining the dry film stack. In addition, when a photosensitive polymeric layer with a high melting point is used in a lower temperature lamination process, the photosensitive polymeric layer can have poor adhesion with the substrate.

In some embodiments, the dry film structure includes a protective layer (e.g., a protective film or a protective cover sheet) so that the photosensitive polymeric layer is disposed between the protective layer and the carrier substrate. The protective layer can protect the photosensitive polymeric layer during transit and storage, and keeping the tacky photosensitive polymeric layer from sticking to itself. In some embodiments, the protective layer is a single or multiple layer film which optionally has undergone treatment to modify the surface of the film that will contact the photosensitive polymeric layer of the dry film structure. The protective layer can be made from polyethylene, polypropylene, or any other suitable polymer. In some embodiments, adhesion of the protective layer to the photosensitive polymeric layer is less than that of the carrier substrate to the photosensitive polymeric layer. This allows for easy separation of the protective layer from the photosensitive polymeric layer without also separating the photosensitive polymeric layer from the carrier substrate. The protective layer can be laminated to the photosensitive polymeric layer by a roll compression method.

In some embodiments, the protective layer can have a Young's modulus in the range of at least about 100 MPa (e.g., at least about 150 MPa, at least about 200 MPa, or at least about 250 MPa) to at most about 500 MPa (e.g., at most about 450 MPa, at most about 400 MPa, or at most about 350 MPa).

In general, the dry film structure described herein can be used to laminate the photosensitive polymeric layer to a substrate (e.g., an electronic substrate). In some embodiments, the photosensitive polymeric layer of the dry film structure can be laminated to any type of substrates (e.g., electronic substrates) using a differential pressure laminator where vacuum, heat, and pressure are combined for voidless lamination. Examples of suitable electronic substrates include a silicon substrate, a copper substrate, an aluminum substrate, a silicon oxide substrate, a silicon nitride substrate, a glass substrate, an organic laminate substrate, or a dielectric material substrate. For example, the protective layer of the dry film structure can be peeled off, and the remainder of the structure (e.g., a photosensitive polymeric layer on a carrier substrate) can then be cut to the substrate size. As another example, the dry film structure can be cut to the substrate size and then the protective layer can be peeled off to laminate the photosensitive polymeric layer onto a substrate. In some embodiments, these substrates, pre-laminated either manually or with the assistance of currently available dispensing equipment, are placed on the slide mounted platen or positioned in a chamber. Substrates varying in thickness and geometry can be intermixed to increase throughput. The substrate can then be exposed to a vacuum dwell for a time determined by an integral precision digital timer. Following this period, a preheated silicone rubber diaphragm can descend onto the work piece. This action can close the small gap below the spring-mounted platen assembly and provides direct thermal contact with the lower heat platen. The temperatures of both the upper and lower heated platens can be controlled independently by integral temperature controllers. Differential pressure laminator generally permits the addition of positive pressure above the diaphragm, increasing the effective lamination pressure dramatically. The pressure dwell period can be adjusted with a timer identical to that employed in the vacuum dwell. Upon completion of a cycle, the drawer mechanism can be retracted and the laminated substrate can be removed for further processing.

In some embodiments, the photosensitive polymeric layer can be laminated to a substrate through a vacuum lamination at 60° C. to 140° C. after pre-laminating of the photosensitive polymeric layer of the dry film structure with a plane compression method or a hot roll compression method. When the hot roll lamination is employed, the dry film structure can be placed into a hot roll laminator, the protective layer can be peeled away from the photosensitive polymeric layer/carrier substrate, and the photosensitive polymeric layer can be brought into contact with and laminated to a substrate using rollers with heat and pressure.

In some embodiments, the lamination temperature used in the lamination process described above is at least about 50° C. (e.g., at least about 70° C., at least about 80° C., at least about 90° C., or at least about 100° C.) to at most about 220° C. (e.g., at most about 190° C., at most about 170° C., at most about 160° C., at most about 130° C., or at most about 110° C.). The pressure used in the lamination process described above is at least about 1.5 psi (e.g., at least about 3 psi, at least about 5 psi, at least about 10 psi, at least about 15 psi, or at least about 20 psi) to preferably at most about 70 psi (e.g., at most about 60 psi, at most about 50 psi, at most about 40 psi, or at most about 30 psi). The vacuum used in the lamination process described above can be at least about 0.2 Torr to at most about 5 Torr. The speed of the roller used in the lamination process described above can be at least about 1 cm/min (e.g., at least about 5 cm/min, at least about 10 cm/min, at least about 25 cm/min, or at least about 50 cm/min) to at most about 600 cm/min (e.g., at most about 500 cm/min, at most about 400 cm/min, at most about 300 cm/min at most about 200 cm/min, or at most about 100 cm/min).

In some embodiments, this disclosure features a process of forming a laminate. The process can include applying the dry film structure onto an electronic substrate to form a laminate. In embodiments where the protective layer is present in the dry film structure, the process can further include removing the protective layer from the dry film structure before applying the dry film structure onto the electronic substrate. In some embodiments, the process can further include converting the photosensitive polymeric layer into a patterned layer. The conversion can include exposing the photosensitive polymeric layer in the laminate to actinic radiation. In such embodiments, the conversion can further include removing the carrier substrate before or after exposing the photosensitive polymeric layer. After the photosensitive polymeric layer is exposed to actinic radiation, the conversion can further include developing the exposed photosensitive polymeric layer to form a patterned layer having a relief pattern. The developing can include removing unexposed portions in the polymeric layer by using a developer to form a patterned layer having a relief pattern and rinsing the relief pattern on the substrate with a solvent or a mixture of solvents.

In some embodiments, the laminated photosensitive polymeric layer on an electronic substrate is exposed through a desired patterned photomask such that the exposed areas in the photosensitive polymeric layer are crosslinked. The cross-linking can occur between the molecules of the reactive functional compound, between the molecules of the reactive functional compound and the polyimide polymer, or between the molecules of the polyimide polymer in the photosensitive polymeric layer. Examples of active energy beams used for exposure include electron beams, ultraviolet light and X-ray, with ultraviolet light being preferable. As a light source, it is possible to use a low-pressure mercury lamp, high-pressure mercury lamp, extra-high-pressure mercury lamp, halogen lamp, etc. The exposure dose is typically from about 100 mJ/cm$^2$ to about 1,000 mJ/cm$^2$.

The carrier substrate can be removed by peeling before or after the exposure.

After the exposure, the photosensitive polymeric layer of the dry film structure can be heat treated to at least about 50° C. (e.g., at least about 55° C., at least about 60° C., or at least about 65° C.) to at most about 100° C. (e.g., at most about 95° C., or at most about 90° C., at most about 85° C., at most about 80° C., at most about 75° C., or at most about 70° C.) for at least about 60 seconds (e.g., at least about 65 seconds, or at least about 70 seconds) to at most about 90 seconds (e.g., at most about 85 seconds, or at most about 80 seconds). The heat treatment is usually accomplished by use of a hot plate or oven.

After the exposure, the photosensitive polymeric layer of the dry film structure can be developed to remove unexposed portions by using a developer. Development can be carried out by, for example, an immersion method or spraying method. Microholes and fine lines can be generated in the photosensitive polymeric layer on the laminated substrate after development.

Examples of developers for developing the photosensitive polymeric layer include an organic solvent or a mixture of organic solvents. Suitable examples of organic solvents include, but are not limited to, gamma-butyrolactone (GBL), N-methyl-2-pyrrolidone (NMP), N-ethyl-2-pyrrolidone, N-butyl-2-pyrrolidone, N-formylmorpholine, dimethylimidazolidinone, N-methylcaprolactam, N-methylpropionamide, N,N-dimethylacetamide (DMAc), dimethyl sulfoxide (DMSO), N,N-dimethylformamide (DMF), N,N-diethylformamide, diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol 1,4:3,6-dianhydrosorbitol 2,5-dimethyl ether (2,5-dimethylisosorbide), 1,4:3,6-dianhydrosorbitol 2,5-diethyl ether (2,5-diethylisosorbide) and mixtures thereof. Preferred solvents are gamma-butyrolactone (GBL), cyclopentanone (CP), cyclohexanone, 2,5-dimethyl ether (2,5-dimethylisosorbide), ethyl lactate (EL), n-butyl acetate (nBA) and dimethylsulfoxide (DMSO). These solvents can be used individually or in combination of two or more to improve the image quality.

In some embodiments, the developer and the polyimide polymer in the photosensitive polymeric layer can have a relative energy difference (RED) of at most about 3 (e.g., at most about 2.5, at most about 2, at most about 1.5, or at most about 1) and/or at least about 0.1 (e.g., at least about 0.2, at least about 0.5, at least about 0.7, or at least about 1). RED is the ratio of distance between Hansen parameters (Ra) and the interaction radius (Ro). In general, the lower the RED, the better solubility the polyimide polymer has in the solvent. Ra is defined by the following formulation: $(Ra)^2 = 4(\delta_{d2}-\delta_{d1})^2 + (\delta_{p2}-\delta_{p1})^2 + (\delta_{h2}-\delta_{p1})^2$ in which $\delta_d$, $\delta_p$ and $\delta_h$ are respectively the energy between dispersion, intermolecular force and hydrogen bonds between molecules. Ra determines the radius of the sphere in Hansen space and its center is the three Hansen parameters. More detail on Hansen parameters can be found in the following reference: "Hansen, Charles (2007). Hansen Solubility Parameters: A user's handbook, Second Edition. Boca Raton, Fla: CRC Press. ISBN 978-0-8493-7248-3".

In some embodiments, after the development, an optional rinse treatment can be carried out with an organic rinse solvent. Suitable examples of organic rinse solvents include, but are not limited to, alcohols such as isopropyl alcohol, methyl isobutyl carbinol (MIBC), propylene glycol monomethyl ether (PGME), and amyl alcohol; esters such as n-butyl acetate (nBA), ethyl lactate (EL) and propylene glycol monomethyl ether acetate (PGMEA); ketones such as cyclopentanone (CP); and mixtures thereof. A rinse solvent can be used to carry out the rinse treatment to remove residues.

In some embodiments, after the development step or the optional rinse treatment step, an optional baking step (i.e., a post development bake) can be carried out at a temperature ranging from at least about 120° C. (e.g., at least about 130° C., at least about 140° C., at least about 150° C., at least about 160° C., at least about 170° C., or at least about 180° C.) to at most about 250° C. (e.g., at most about 240° C., at most about 230° C., at most about 220° C., at most about 210° C., at most about 200° C. or at most about 190° C.). The baking time is at least about 5 minutes (e.g., at least about 10 minutes, at least about 20 minutes, at least about 30 minutes, at least about 40 minutes, at least about 50 minutes, or at least about 60 minutes) and/or at most about 5 hours (e.g., at most about 4 hours, at most about 3 hours, at most about 2 hours, or at most about 1.5 hours). This baking step can remove residual solvent from the remaining photosensitive polymeric layer and can further crosslink the remaining photosensitive polymeric layer. Post development bake can be done in air or preferably, under a blanket of nitrogen and may be carried out by any suitable heating means.

In some embodiments, the resulting baked photosensitive polymeric layer after the baking step has a glass transition temperature of at least about 180° C. (e.g., at least about 190° C., at least about 200° C. or at least about 210° C.). In some embodiments, the resulting baked photosensitive polymeric layer after the baking step has a glass transition of at most about 320° C. (e.g., at most about 310° C., at most about 300° C. or at most about 290° C.). As used herein, the glass transition temperature of the photosensitive polymeric layer is defined as the photosensitive inflection point on a thermo-mechanical analyzer curve plotting dimension change ($\mu$) vs temperature.

In some embodiments, a high glass transition temperature for the baked photosensitive polymeric layer can be desirable to prevent film mobility during subsequent processing steps of device manufacture and subsequent device use for longer device life. Some manufacturing processing steps such as soldering require elevated temperatures. High glass transition temperature for the baked photosensitive polymeric layer can help maintain mechanical integrity of the resulting devices and can improve resistance to various chemicals and particularly to flux.

In general, the processes described above can be used to form an article to be used in a semiconductor device. Examples of such articles include a semiconductor substrate, a flexible film for electronics, a wire isolation, a wire coating, a wire enamel, or an inked substrate. Examples of semiconductor devices that can be made from such articles include an integrated circuit, a light emitting diode, a solar cell, and a transistor.

In some embodiments, this disclosure features a three dimensional object containing at least one patterned film formed by a process described herein. In some embodiments, the three dimensional object can include patterned films in at least two stacks (e.g., at least three stacks).

In some embodiments, the processes described above can result in an article that includes an electronic substrate and a patterned layer (e.g., containing a relief pattern) laminated onto the electronic substrate, in which the patterned layer includes at least one polyimide polymer. Without wishing to be bound by theory, it is believed that the patterned layer thus formed can have a relatively small thickness with a relatively high resolution. For example, the patterned layer can have a thickness of at most about 5 microns (e.g., at most about 4 microns or at most about 3 microns) and include at least one element having a feature size of at most about 3 microns (e.g. at most 2 microns).

In some embodiments, the patterned layer can have a Young's modulus of at least about 1 GPa (e.g., at least about 2 GPa, at least about 3 GPa, at least about 4 GPa, or at least about 5 GPa) to at most about 20 GPa (e.g., at most about 18 GPa, at most about 16 GPa, at most about 14 GPa, at most about 12 GPa, or at most about 10 GPa). In some embodiments, the patterned layer can have a Young's modulus that is about 200% to about 300% as high as the Young's modulus of the photosensitive polymeric layer of the dry film structure.

In some embodiments, the dry film structure described above can further include a second polymeric layer containing at least one water soluble polymer. As defined herein, a "water-soluble" polymer refers to a polymer having a solubility of at least 5% by weight in water at 25° C. Examples of suitable water soluble polymer can be selected from a group consisting of poly(vinyl alcohol), poly(vinyl pyrrolidone), poly(acrylic acid) and the salts thereof, poly(methacrylic acid) and the salts thereof, poly(acrylamide) and the salts thereof, poly(methacrylamide) and the salts thereof, poly(N-isopropylacrylamide) and the salts thereof, poly(2-oxazoline), poly(ethylene oxide), poly(propylene oxide), hydroxyethyl cellulose, hydroxypropyl cellulose, starch, polysaccharides, dextran, cyclodextran, and partially hydrolyzed polyvinyl acetate.

In some embodiments, the second polymeric layer can be between the photosensitive polymeric layer and the carrier substrate in the dry film structure. In such embodiments, when the dry film structure is laminated onto an electronic substrate and the carrier substrate is removed, the laminate thus formed includes the electronic substrate, the photosensitive polymeric layer disposed thereupon, and the second water soluble polymeric layer disposed on the photosensitive polymeric layer. In such embodiments, the second polymeric layer can improve the post exposure delay stability of the photosensitive polymeric layer by serving as a protecting layer. In such embodiments, the second polymeric layer can be removed by using water after exposure of the laminate to the actinic radiation and before development.

In some embodiments, the second polymeric layer can be between the photosensitive polymeric layer and the protective layer in the dry film structure. In such embodiments, when the dry film structure is laminated onto an electronic substrate and the carrier substrate is removed, the laminate thus formed includes the electronic substrate, the second polymeric layer disposed thereupon, and the photosensitive polymeric layer disposed on the photosensitive polymeric layer. In such embodiments, the second polymeric layer can serve as a protecting layer of the electronic substrate when the electronic substrate is sensitive to an organic developer (e.g., when the electronic substrate is an organic substrate). In such embodiments, after development, part of the water soluble second polymeric layer (i.e., that under the unexposed/developed portion of the photosensitive polymeric layer) can be removed by using water, and the rest of second polymeric layer (i.e., that under the exposed/undeveloped portion of the photosensitive polymeric layer) can remain in the device thus formed.

The contents of all publications cited herein (e.g., patents, patent application publications, and articles) are hereby incorporated by reference in their entirety.

The disclosure will now be described in greater detail by reference to the following non-limiting examples.

EXAMPLES

Synthesis Example 1 (Poly-1)

Structure of P-1

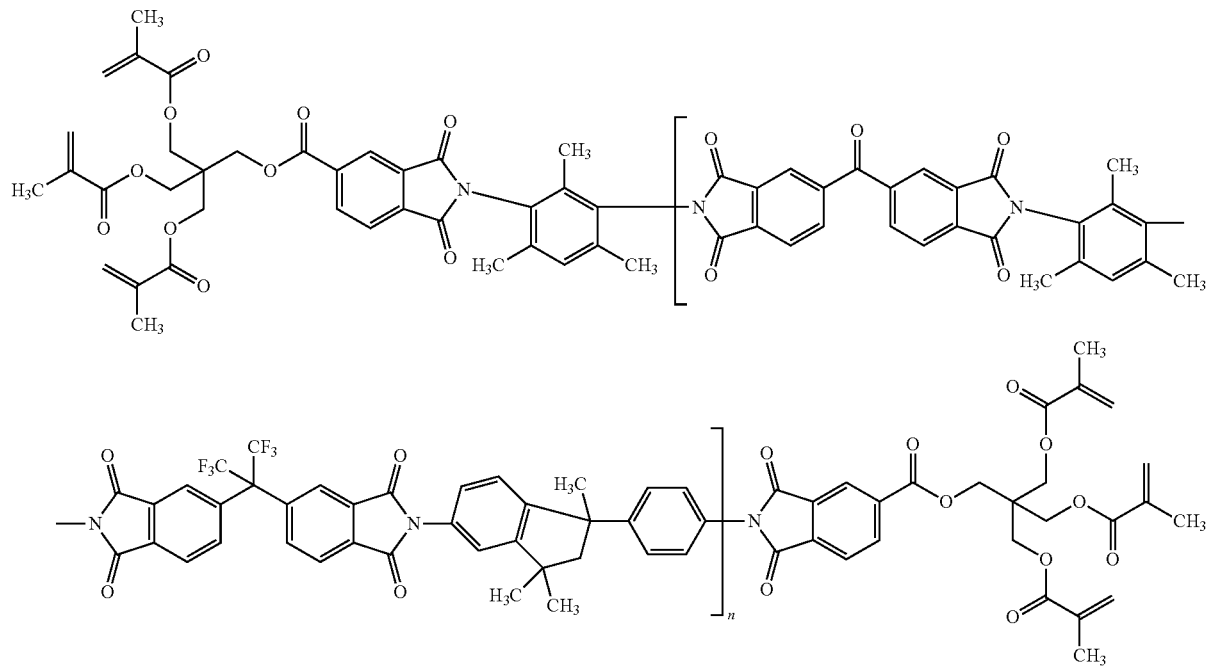

The polymerization reaction was performed in a one liter three-neck, jacketed round bottomed flask equipped with a mechanical agitator, a thermocouple and a nitrogen inlet to keep positive nitrogen pressure throughout the reaction. The flask was charged with 101.9 grams of benzophenone-3,3', 4,4'-tetracarboxylic dianhydride (BTDA), 35.10 grams of hexafluoroisopropylidenediphthalic anhydride (6FDA) and 178.0 grams of anhydrous NMP. The contents were agitated at 18-20° C. 53.35 grams of 1-(4-aminophenyl)-1,3,3-trimethylindan-5-amine (DAPI), and 30.20 grams of 2,4-diamino-1,3,5-trimethylbenzene (DAM) were dissolved in 358 grams of dry NMP in a bottle. The diamine solution was added to the flask by pump for 1 hour at room temperature. The mixture was warmed to 60° C. and agitated for 3 hours to produce a polyamic acid.

To endcap the polyamic acid formed above, 20.5 grams of 3-acryloyloxy-2,2-bis[(acryloyloxy)methyl]propyl 1,3-dioxo-1,3-dihydro-2-benzofuran-5-carboxylate (PETA) was charged to the flask. The mixture was agitated at 60° C. for 3 hours to form an endcapped polyamic acid.

To perform the imidization reaction of the above endcapped polyamic acid, 50.0 grams of acetic anhydride and 20.0 grams of pyridine were charged to the flask. The reaction mixture was warmed to 110° C. and agitated for 12 hours. A small sample (1 g) was withdrawn and precipitated into 50:50 methanol:water (10 ml). The solid was isolated by filtration and dried. FTIR analysis showed that the imidization reaction was complete (showed absence of amide and anhydride peaks).

The solution was cooled to room temperature and added dropwise to 10 liters of vigorously stirred de-ionized water to precipitate the polymer. The polymer was collected by filtration and washed with 600 grams of de-ionized water. The cake was re-slurried with four liters of methanol and filtered. The wet cake was dried in air for 12 hours and then the polymer was dried under vacuum at 70° C. for 15 hours. The molecular weight of the resultant polyimide polymer measured by GPC was 32800 Daltons.

Composition Example 1

Formulation of a Polymer Solution for Preparation of Dry Film (F-1)

To a 3-neck round bottom flask equipped with a mechanical stirrer was added 500 parts of GBL, 85.2 parts of the polymer obtained in Synthesis Example 1, 6 parts of a 0.5% solution of PolyFox 6320 (available from OMNOVA Solutions), 3 parts of (3-glycidyloxypropyl)trimethoxy silane, 3 parts of NCl-831 (trade name, available from ADEKA corporation), 2 parts of diphenyl(2,4,6-trimethylbenzoyl) phosphine oxide, 33.75 parts of tetraethylene diacrylate, 11.25 parts of pentaerylthritol triacrylate and 15.1 g of polyamic ester of Structure PAE-1. The above composition was mechanically stirred for 18 hours and was then filtered by using a 1.0 μm filter (Ultradyne from Meissner Filtration Product, Inc., cat. no. CFTM11.0-44B1).

was lowered and the thermal equilibrium was allowed to be reached. The viscosity of the samples and corresponding melt temperatures are summarized in Table 1.

TABLE 1

| Temperature, ° C. | Viscosity, P |
|---|---|
| 50 | 74.4 |
| 60 | 69.0 |
| 70 | 60.9 |
| 80 | 71.1 |
| 90 | 77.8 |
| 100 | 119.6 |

Lamination of Dry Film; Example L-1

After the removal of the protective layer by peeling, the photosensitive polymeric layer of dry film structure DF-1 (6"×6") was placed on 4" Wafernet copper coated wafer). The polymeric layer was laminated onto Cu coated wafer by vacuum lamination (0.54-0.6 Torr) at 80° C. followed by being subjected to a pressure of 40 psi. Lamination process was done by using a DPL-24A Differential Pressure Laminator manufactured by OPTEK, NJ.

Lithographic Evaluation of Laminated DF-1

The carrier substrate of the copper wafer laminated by composition DF-1 in Example L-1 was removed. The pho- Structure PAE-1

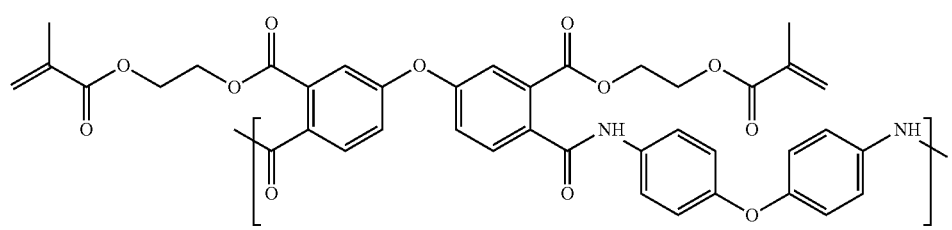

Dry Film Example DF-1

A filtered photosensitive solution of F-1 was applied via slot-die coater from Frontier Industrial Technologies (Towanda, PA) with a line speed of 10 feet/minutes (300 cm per minutes) onto a polyethylene terephthalate (PET) film TA 30 (manufactured by Toray Plastics America, Inc.) having a thickness of 36 μm used as a carrier substrate and dried at 200° F. to obtain a photosensitive polymeric layer with a thickness of approximately 4.0 microns. The speed of pump was 14 RPM. On this polymeric layer, a biaxially oriented polypropylene (BOPP) film (manufactured by IMPEX GLOBAL LLC, trade name 80 ga BOPP) was laid over by a roll compression to act as a protective layer.

Melt Viscosity Measurement of Dry Film DF-1

A Brookfield Viscometer Model CAP 2000+H was used to measure the melt viscosity of the unbaked polymeric layer in the dry film DF-1 described above. This viscometer was designed to measure viscosity of samples at temperatures ranged from 50° C. to 235° C. The polymeric layer was separated from the protective layer and the carrier substrate, and was cut into small pieces. The amount of sample equivalent to about 40 micro-liter was placed onto the center of the viscometer plate which was set at 50° C. The spindle tosensitive polymeric layer was then exposed to actinic light utilizing an i-line stepper in a patterned exposure array, which incrementally increased exposure energy by 50 mJ/cm² with a starting exposure energy of 50 mJ/cm². The exposed film was then heated at 50° C. for 3 minutes, and developed using two 30-second puddles with a solution containing 70% GBL and 30% cyclopentanone. The film was then washed with PGMEA. A relief pattern with a resolution of 2 microns was obtained at energy dose of 100 mJ/cm². The final film thickness was 3.6 μm and film thickness loss was 10.0%.

Composition Example 2

Formulation of a Polymer Solution for Preparation of Dry Film (F-2)

Formulation F-2 was prepared in the same manner as F-1 except that the amount of GBL was reduced from 500 parts to 313.1 parts.

Dry Film Example DF-2

A filtered photosensitive solution of F-2 was applied via slot-die coater from FujiFilm Manufacturing USA (Greenwood, SC) with a line speed of 2.5 feet/minutes (75 cm per minutes) onto a polyethylene terephthalate (PET) from Mitsubishi used as a carrier substrate and dried at 210° F. to obtain a photosensitive polymeric layer with a thickness of approximately 2.1 microns. The speed of pump was 5 RPM. On this polymeric layer, a biaxially oriented polypropylene (BOPP) film (manufactured by IMPEX GLOBAL LLC, trade name 80 ga BOPP) was laminated by a roll compression to act as a protective layer.

Lamination of Dry Film; Example L-2

After the removal of the protective layer by peeling, the photosensitive polymeric layer of dry film structure DF-2 (6"×6") was placed on a 4" Wafernet copper coated wafer). The polymeric layer was laminated onto the Cu coated wafer by vacuum lamination (0.48-0.6 Torr) at 80° C. for 90 seconds followed by being subjected to a pressure of 40 psi. Lamination process was done by using a DPL-24A Differential Pressure Laminator manufactured by OPTEK, NJ.

Lithographic Evaluation of Laminated DF-2

The carrier substrate of the copper wafer laminated by composition DF-2 in Example L-2 was removed. The photosensitive polymeric layer was then exposed to actinic light utilizing an i-line stepper in a patterned exposure array, which incrementally increased exposure energy 50 mJ/cm$^2$ with a starting exposure energy of 50 mJ/cm$^2$. The exposed film was then heated at 50° C. for 3 minutes, and developed using two 45-second puddles with a solution containing 70% GBL and 30% cyclopentanone. The film was then washed with PGMEA. A relief pattern with a resolution of 2 microns was obtained at energy dose of 100 mJ/cm$^2$. The final film thickness was 1.92 μm and film thickness loss was 16.9%.

Synthesis Example 2 (P-2)

with water. The amounts of organic solvents (ethyl acetate and acetone) and water used in all of the washes are shown in Table 2.

TABLE 2

| | Wash 1 | Wash 2 | Wash 3 |
|---|---|---|---|
| Ethyl Acetate (kg) | 20.5 | 4.1 | 4.1 |
| Acetone (kg) | — | 2.3 | 2.3 |
| Water (kg) | 22.0 | 26.0 | 26.0 |

GBL (10 kg) was added to the washed organic phase and the solution was concentrated by vacuum distillation to give a polymer solution P-1. The solid % of final polymer was 29.94% and the weight average molecular weight (Mw) measured by GPC was 51,000 Daltons.

To measure the molecular weight by GPC, 200 mg of the above polymer solution was first dissolved in 3.2 g of tetrahydrofuran (THF) that included BHT. The instrument used was a Waters Gel Permeation Chromatograph and the software was Waters Empower 2 Chromatographic software (GPC module). The standard used was five polystyrene standards and one p-cresol dimer standard. Their Mw values were as follows: 198400, 89300, 19100, 4000, and 1200 for polystyrene standards and 228 for p-cresol dimer. The column used was a Phenomenex Guard column: Phenogel-10, 7.8 mm ID×50 mm length and the flow rate was one milliliter per minute at 35° C.

Composition Example 3

Formulation of a Polymer Solution for Preparation of Dry Film (F-3)

A photosensitive composition was prepared by using 193.6 g of polymer (P-2), 43.0 g of GBL, 3.75 g of a 0.5 wt Structure of P-2

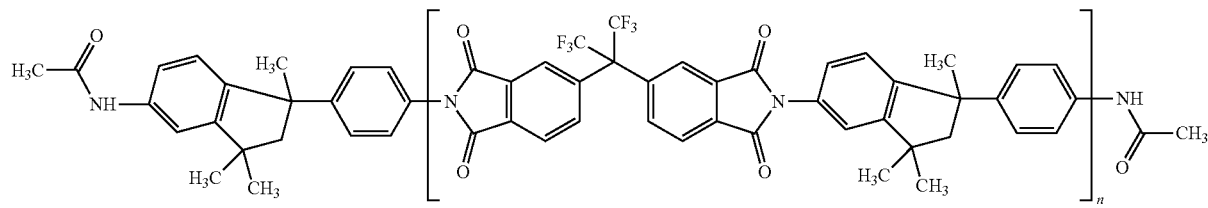

Solid 4,4'-(hexafluoroisopropylidene)bis(phthalic anhydride) (6FDA) (2.370 kg, 5.33 mole) was charged to a solution of 1-(4-aminophenyl)-1,3,3-trimethylindan-5-amine (also known as 4,4'[1,4-phenylene-bis(1-methylethylidene)]bisaniline (DAPI)) (1.465 kg, 5.51 mole) in NMP (9.86 kg) at 25° C. The reaction mixture temperature was increased to 40° C. and allowed to react for 6 hours. Next, acetic anhydride (1.125 kg) and pyridine (0.219 kg) were added and the reaction mixture temperature was increased to 100° C. and allowed to react for 12 hours.

The reaction mixture above was cooled to room temperature and transferred to a larger vessel equipped with a mechanical stirrer. The reaction solution was diluted with ethyl acetate and washed with water for one hour. After the stirring was stopped, the mixture was allowed to stand undisturbed. Once phase separation had occurred, the aqueous phase was removed. The organic phase was diluted with a combination of ethyl acetate and acetone and washed twice % solution of PolyFox 6320 (available from OMNOVASolutions) in GBL, 3.15 g of methacryloxypropyltrimethoxysilane, 1.90 g of NCl-831 (trade name, available from ADEKA corporation), 0.15 g para-benzoquinone, 21.10 g of tetraethylene glycol diacrylate and 7.05 g of pentaerythritol triacrylate. After being stirred mechanically for 24 hours, the solution was filtered using a 0.2 μm filter (Ultradyne from Meissner Filtration Product, Inc., cat. no. CFTM10.2-44B1).

Dry Film Example DF-3

The filtered photosensitive solution F-3 was applied using reverse microbar coater from Fujifilm Manufacturing USA (Greenwood, SC) with a line speed of 2 feet/minutes (60 cm per minutes) with 30 um microbar clearance onto a polyethylene terephthalate (PET) film (TA 30, manufactured by Toray Plastics America, Inc.) having a width of 16.2" and thickness of 35 μm used as a carrier substrate and dried at 210° F. to obtain a photosensitive polymeric layer with a thickness of approximately 5.0 microns. On this polymeric layer, a biaxially oriented polypropylene film having width of 18" and thickness of 20 μm (BOPP, manufactured by Mirwec Film Inc, Bloomington, IN trade name BOPLON) was laid over by a roll compression to act as a protective layer.

Lamination of Dry Film; Example L-3

After the removal of the protective layer by peeling, the photosensitive polymeric layer of dry film structure DF-3 (6"×6") was placed on a 4" Wafernet copper coated wafer. The polymeric layer was laminated onto the Cu coated wafer by vacuum lamination (0.2-0.4Torr) at 90° C. for 90 seconds followed by being subjected to a pressure of 40 psi (in the first 20 seconds only vacuum was applied, then in the next 90 seconds both pressure and vacuum was applied). Lamination process was done by using a DPL-24A Differential Pressure Laminator manufactured by OPTEK, NJ Lithographic Evaluation of Laminated DF-3

The carrier substrate of the copper wafer laminated by dry film structure DF-3 in Example L-3 was removed. The photosensitive polymeric layer was then exposed to actinic light utilizing an i-line stepper in a patterned exposure array, which incrementally increased exposure energy by 50 mJ/cm$^2$ with a starting exposure energy of 50 mJ/cm$^2$. The exposed film was then heated at 50° C. for 3 minutes, and developed using two 75-second puddles using cyclopentanone. The film was then washed with PGMEA for 15 seconds. A relief pattern with a resolution of 2 microns was obtained at energy dose of 100 mJ/cm$^2$. The film thickness loss was 26.7%.

Synthesis Example 3 (Poly-3)

The procedure was the same as for Synthesis Example 1 except that the ratio of dianhydrides to diamines was 0.95.

The work-up was similar to Synthesis Example 1. The molecular weight of the resultant polyimide polymer measured by GPC was 24,000 Daltons.

Composition Example 4

Formulation of a Polymer Solution for Preparation of Dry Film (F-4)

To a 3-neck round bottom flask equipped with a mechanical stirrer was added 550 parts of GBL, 100 parts of the polymer Poly-3 obtained in Synthesis Example 3,3 parts of a 0.5% solution of PolyFox 6320 (available from OMNOVA Solutions), 3 parts of (3-glycidyloxypropyl)trimethoxy silane, 3 parts of NCI-831 (trade name, available from ADEKA corporation), 33.75 parts of tetraethylene diacrylate, 11.25 parts of pentaerylthritol triacrylate and 0.2 parts of p-benzoquinone. The above composition was mechanically stirred for 18 hours and was then filtered by using a 0.2 μm filter (Ultradyne from Meissner Filtration Product, Inc., cat. no. CFTM10.2-44B1).

Dry Film Example DF-4

Procedure was the same as that for DF-3 except a filtered photosensitive solution of F-4 was used to obtain a photosensitive polymeric layer with a thickness of approximately 5.0 microns.

Lamination of Dry Film; Example L4

Procedure was the same as for L3 except dry film DF-4 was used.

While the subject matter of this disclosure has been described in detail with reference to certain embodiments thereof, it will be understood that modifications and variations are within the spirit and scope of that which is described and claimed.

What is claimed is:

1. A dry film structure, comprising:
   a carrier substrate;
   a first polymeric layer supported by the carrier substrate, wherein the first polymeric layer is a photosensitive polymeric layer, and the photosensitive polymeric layer comprises at least one fully imidized polyimide polymer; and
   a second polymeric layer, wherein the second polymeric layer is between the photosensitive polymeric layer and the carrier substrate and the second polymeric layer consists of at least one water soluble polymer;
   wherein the photosensitive polymeric layer has a film thickness of at most about 5 microns.

2. A dry film structure of claim 1 wherein, the photosensitive polymeric layer further comprises
   at least one reactive functional compound; and
   at least one photoinitiator.

3. The dry film structure of claim 2, wherein the reactive functional compound comprises at least one functional group selected from the group consisting of a vinyl group, an allyl group, a vinyl ether group, a propenyl ether group, a (meth)acryloyl group, an a SiH group, and a thiol group.

4. The dry film structure of claim 3, wherein the reactive functional compound is selected from the group consisting of 1,6-hexanediol di(meth)acrylate, tetraethyleneglycol di(meth)acrylate, divinylbenzene, ethoxylated bisphenol-A-di(meth)acrylate, diethylene glycol bis(allyl carbonate), trimethylolpropane tri(meth)acrylate, ditrimethylolpropane tetra(meth)acrylate, pentaerythritol tri(meth)acrylate, pentaerythritol tetra(meth)acrylate, dipentaerythritol penta-/hexa-(meth)acrylate, isocyanurate tri(meth)acrylate, bis(2-hydroxyethyl)-isocyanurate di(meth)acrylate, 1,3-butanediol tri(meth)acrylate, 1,4-butanediol tri(meth) acrylate, methyl (meth)acrylate, butyl (meth)acrylate, cyclohexyl (meth)acrylate, benzyl(meth)acrylate, neopentyl glycol di(meth)acrylate, (meth)acrylate modified-urea-formaldehyde resins, (meth)acrylate modified melamine-formaldehyde resins and (meth)acrylate modified cellulose.

5. The dry film structure of claim 1, wherein the at least one fully imidized polyimide polymer is prepared from at least one diamine, the at least one diamine comprising a compound selected from the group consisting of a diamine of Structure (Ia) and a diamine of Structure (Ib),

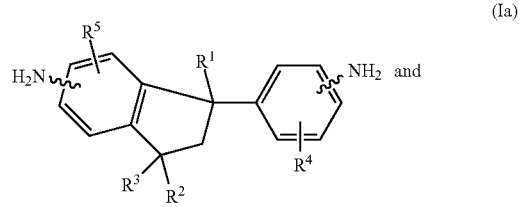

(Ia)

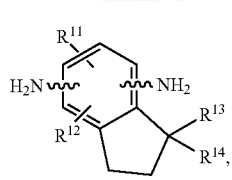

(Ib)

in which each of $R^1$, $R^2$, $R^3$, $R^4$, $R^5$, $R^{11}$, $R^{12}$, $R^{13}$, and $R^{14}$, independently, is H, a substituted or unsubstituted $C_1$-$C_6$ linear or branched alkyl group, or a $C_5$-$C_7$ cycloalkyl group.

6. The dry film structure of claim 5, wherein the at least one diamine is selected from the group consisting of 1-(4-aminophenyl)-1,3,3-trimethylindan-5-amine, 1-(4-aminophenyl)-1,3,3-trimethyl-2H-inden-5-amine, 1-(4-aminophenyl)-1,3,3-trimethyl-indan-5-amine, [1-(4-aminophenyl)-1,3,3-trimethyl-indan-5-yl]amine, 1-(4-aminophenyl)-2,3-dihydro-1,3,3-trimethyl-1H-inden-5-amine, 5-amino-6-methyl-1-(3'-amino-4'-methylphenyl)-1,3,3-trimethylindan, 4-amino-6-methyl-1-(3'-amino-4'-methylphenyl)-1,3,3-trimethylindan, 5,7-diamino-1,1-dimethylindan, 4,7-diamino-1,1-dimethylindan, 5,7-diamino-1,1,4-trimethylindan, 5,7-diamino-1,1,6-trimethylindan, and 5,7-diamino-1,1-dimethyl-4-ethylindan.

7. The dry film structure of claim 5, wherein the at least one diamine further comprises at least one diamine of Structure (II),

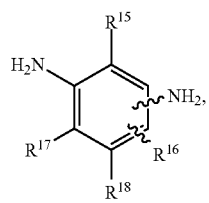

(II)

wherein $R^{15}$, $R^{16}$, $R^{17}$ and $R^{18}$, independently, is H, a substituted or unsubstituted $C_1$-$C_6$ linear or branched alkyl group, or $C_5$-$C_7$ cycloalkyl group, provided that at least two of $R^{15}$, $R^{16}$, $R^{17}$ and $R^{18}$ are not hydrogen.

8. The dry film structure of claim 7, wherein the at least one diamine of Structure (II) is selected from the group consisting of 2,3,5,6-tetramethylphenylene-diamine, 2,4-diamino-1,3,5-trimethylbenzene, 2,4-diamino-1,3,5-triethylbenzene, 2,4-diamino-3,5-dimethyl-1-ethylbenzene, 2,4-diamino-1,5-dimethyl-3-ethylbenzene 2,4-diamino-1,3,5-triisopropylbenzene, 2,3,5,6-tetraisopropyl-phenylenediamine, and 2,4-diamino-1,3,5,6-tetramethylbenzene.

9. The dry film structure of claim 1, wherein the at least one fully imidized polyimide polymer is prepared from at least one dianhydride, the at least one dianhydride comprising a compound selected from the group consisting of 3,3',4,4'-benzophenone tetracarboxylic dianhydride, 3, 3', 4, 4'-diphenyl sulfone tetracarboxylic dianhydride, 3, 3 ',4,4'-diphenyl ether tetracarboxylic dianhydride, 2,3,3',4'-diphenyl ether tetracarboxylic dianhydride, and 2,2-[bis(3, 4-dicarboxyphenyl)] hexafluoropropane dianhydride.

10. The dry film structure of claim 1, wherein the at least one fully imidized polyimide polymer is prepared from at least one dianhydride, the at least one dianhydride comprising a compound selected from the group consisting of:

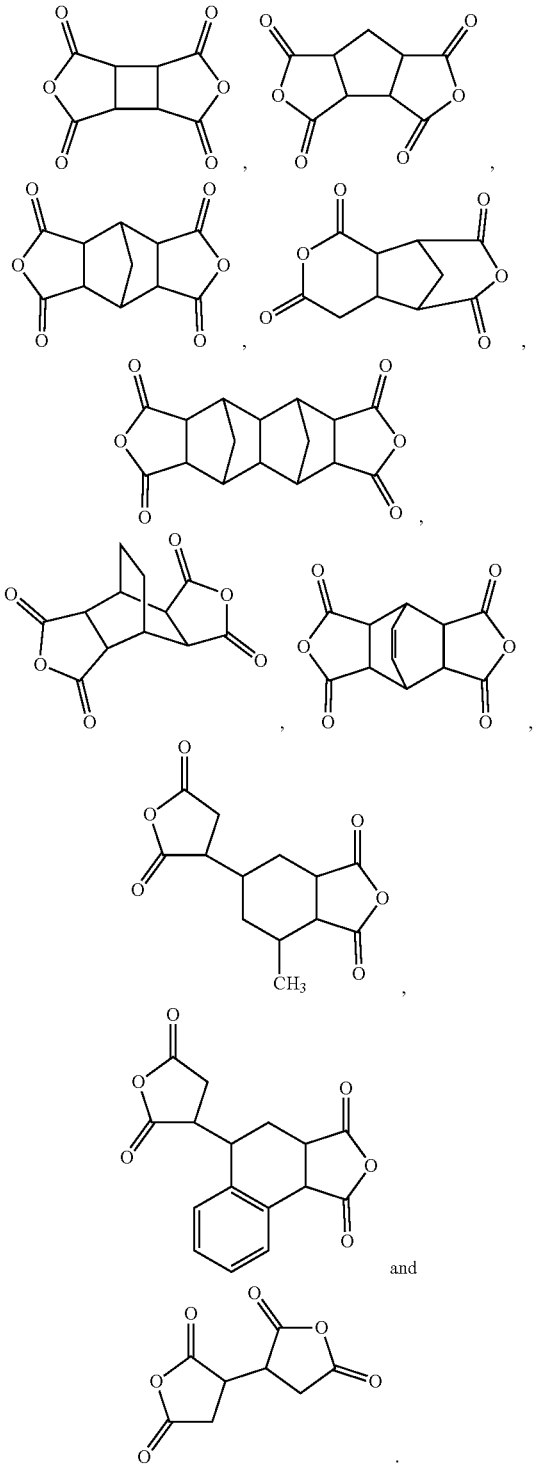

and

11. The dry film structure of claim 1, wherein the photosensitive polymeric layer further comprises at least one adhesion promoter.

12. The dry film structure of claim 1, wherein the photosensitive polymeric layer further comprises at least one surfactant.

13. The dry film structure of claim 1, wherein the photosensitive polymeric layer further comprises at least one plasticizer.

14. The dry film structure of claim 1, wherein the photosensitive polymeric layer further comprises at least one additional polymer different from the at least one polyimide polymer.

15. The dry film structure of claim 1, wherein the photosensitive polymeric layer further comprises at least one nanoparticle.

16. The dry film structure of claim 1, further comprising a protective layer, wherein the first polymeric layer is between the carrier substrate and the protective layer.

17. The dry film structure of claim 1, wherein the at least one water soluble polymer comprises a polymer selected from the group consisting of poly(vinyl alcohol), poly(vinyl pyrrolidone), poly(acrylic acid) and the salts thereof, poly(methacrylic acid) and the salts thereof, poly(acrylamide) and the salts thereof, poly(methacrylamide) and the salts thereof, poly(N-isopropylacrylamide) and the salts thereof, poly(2-oxazoline), poly(ethylene oxide), poly(propylene oxide), hydroxyethyl cellulose, hydroxypropyl cellulose, starch, polysaccharides, dextran, cyclodextran, and partially hydrolyzed polyvinyl acetate.

18. The dry film structure of claim 1, wherein the photosensitive polymeric layer further comprises at least one solvent.

19. The dry film structure of claim 18, wherein the solvent is from about 0.5 wt % to about 20 wt % of total weight of the photosensitive polymeric layer.

20. The dry film structure of claim 1, wherein the photosensitive polymeric layer has a film thickness of at most about 4 microns.

21. The dry film structure of claim 1, wherein the photosensitive polymeric layer has a film thickness of at most about 3 microns.

22. The dry film structure of claim 1, wherein the photosensitive polymeric layer is a patterned layer comprising at least one element having a feature size of at most about 3 microns after the photosensitive polymeric layer is exposed to actinic radiation and developed.

* * * * *

UNITED STATES PATENT AND TRADEMARK OFFICE
CERTIFICATE OF CORRECTION

PATENT NO. : 11,899,364 B2
APPLICATION NO. : 16/822072
DATED : February 13, 2024
INVENTOR(S) : Binod B. De et al.

Page 1 of 1

It is certified that error appears in the above-identified patent and that said Letters Patent is hereby corrected as shown below:

In the Claims

<u>Column 42</u>
Line 26 (Approx.), in Claim 2, delete "A" and insert -- The --
Line 35 (Approx.), in Claim 3, delete "an a" and insert -- a --

<u>Column 43</u>
Line 51, in Claim 8, after "ethylbenzene" insert -- , --
Line 60, in Claim 9, delete "diphenyl sulfone" and insert -- diphenylsulfone --
Line 60, in Claim 9, delete "3 ',4,4'" and insert -- 3',4,4' --
Line 61, in Claim 9, delete "3' ,4'" and insert -- 3',4' --
Line 62, in Claim 9, delete "(3, 4" and insert -- (3,4 --

Signed and Sealed this
Ninth Day of April, 2024

Katherine Kelly Vidal
*Director of the United States Patent and Trademark Office*